United States Patent
Kim

(10) Patent No.: US 9,831,119 B2
(45) Date of Patent: Nov. 28, 2017

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventor: Dong-Kwon Kim, Gimcheon-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 15/189,660

(22) Filed: Jun. 22, 2016

(65) Prior Publication Data

US 2017/0186873 A1 Jun. 29, 2017

Related U.S. Application Data

(60) Provisional application No. 62/271,674, filed on Dec. 28, 2015.

(51) Int. Cl.

| H01L 21/76 | (2006.01) |
|---|---|
| H01L 21/70 | (2006.01) |
| H01L 21/768 | (2006.01) |
| H01L 29/66 | (2006.01) |
| H01L 21/762 | (2006.01) |
| H01L 29/06 | (2006.01) |

(52) U.S. Cl.
CPC .... H01L 21/7682 (2013.01); H01L 21/76264 (2013.01); H01L 29/0649 (2013.01); H01L 29/6653 (2013.01); H01L 29/66545 (2013.01)

(58) Field of Classification Search
CPC .................. H01L 21/7682; H01L 29/0649
USPC .................. 257/374; 438/422, 619
See application file for complete search history.

(56) References Cited

U.S. PATENT DOCUMENTS

| 8,530,971 | B2 | 9/2013 | Cheng et al. |
|---|---|---|---|
| 8,722,474 | B2* | 5/2014 | Yoon ................. H01L 29/66462 257/192 |
| 8,952,452 | B2 | 2/2015 | Kang et al. |
| 9,190,486 | B2 | 11/2015 | Xie et al. |
| 2013/0248950 | A1 | 9/2013 | Kang et al. |
| 2014/0312397 | A1 | 10/2014 | Cheng et al. |
| 2015/0091089 | A1 | 4/2015 | Niebojewski et al. |
| 2015/0214146 | A1 | 7/2015 | Kim et al. |
| 2015/0235897 | A1 | 8/2015 | Fu et al. |

FOREIGN PATENT DOCUMENTS

| KR | 10-0141197 | 3/1998 |
|---|---|---|
| KR | 10-2013-0106622 | 9/2013 |

* cited by examiner

*Primary Examiner* — Calvin Lee
(74) *Attorney, Agent, or Firm* — F. Chau & Associates, LLC

(57) ABSTRACT

A method of fabricating a semiconductor device is provided as follows. An epitaxial layer is formed on an active fin structure. Metal gate electrodes are formed on the active fin structure. Gate electrode caps are formed on upper surfaces of the metal gate electrodes. Metal gate spacers are formed on sidewalls of the metal gate electrodes. A source/drain electrode is formed on the epitaxial layer. An air spacer region is formed by removing the metal gate electrode caps and the metal gate spacers. An air spacer is formed within the air spacer region.

17 Claims, 44 Drawing Sheets

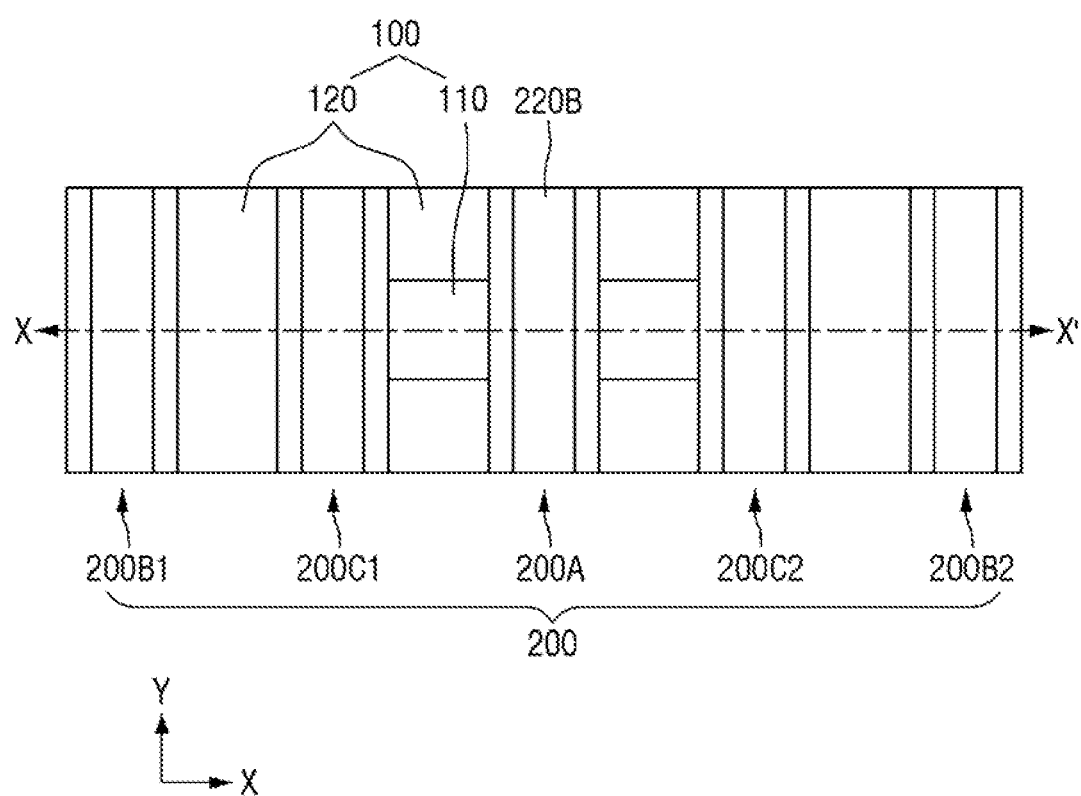

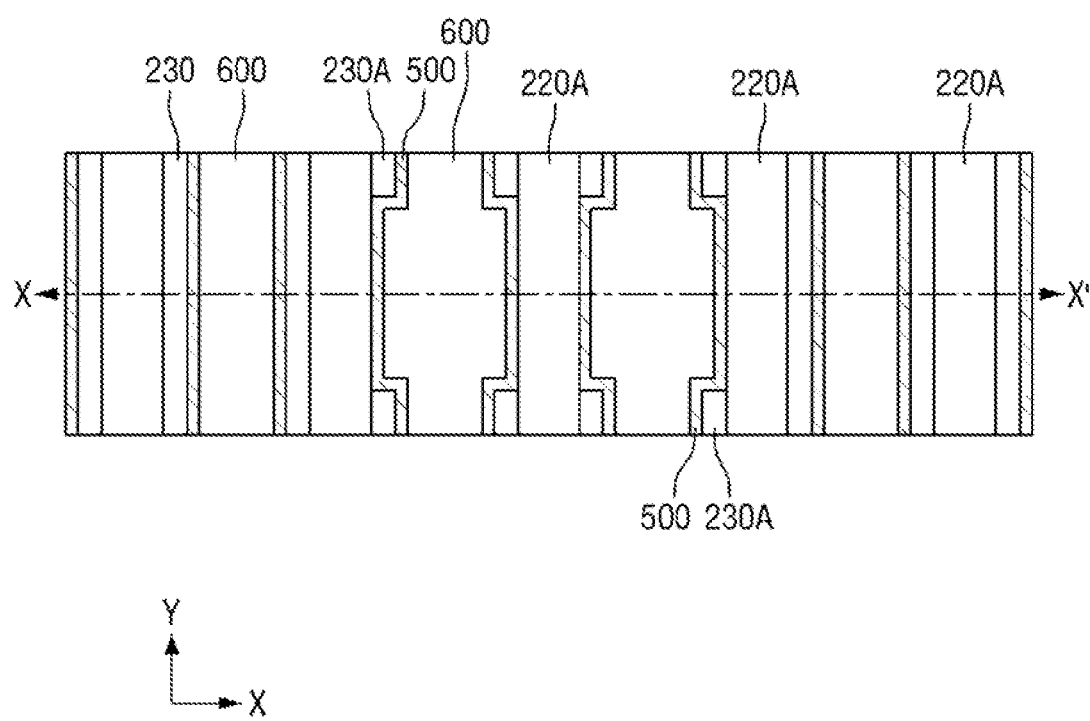

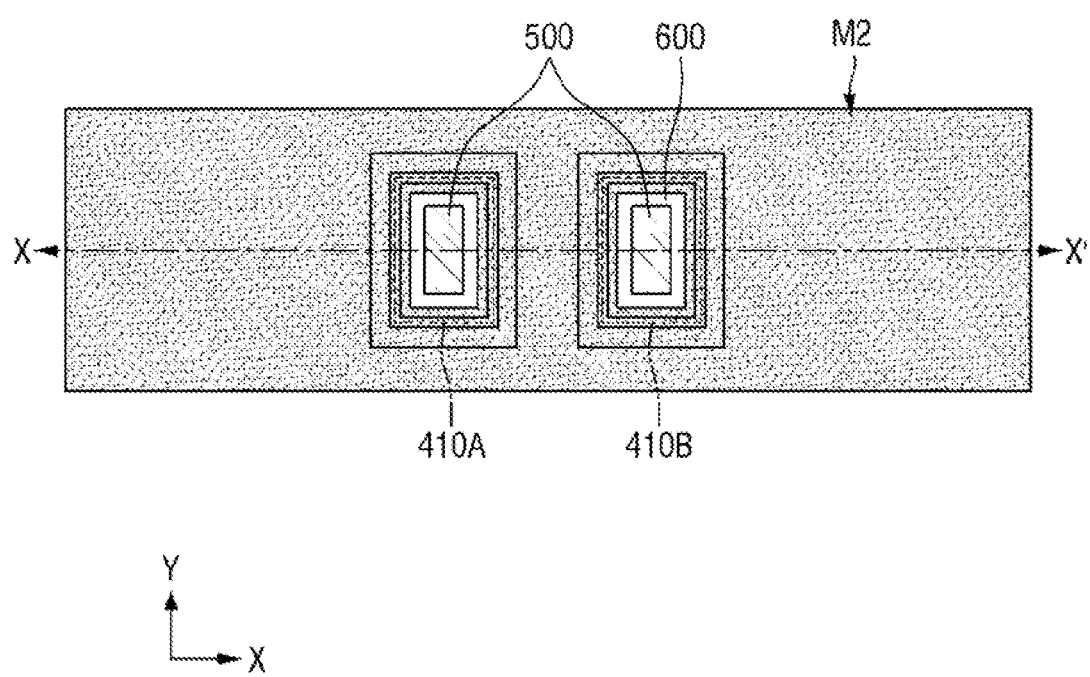

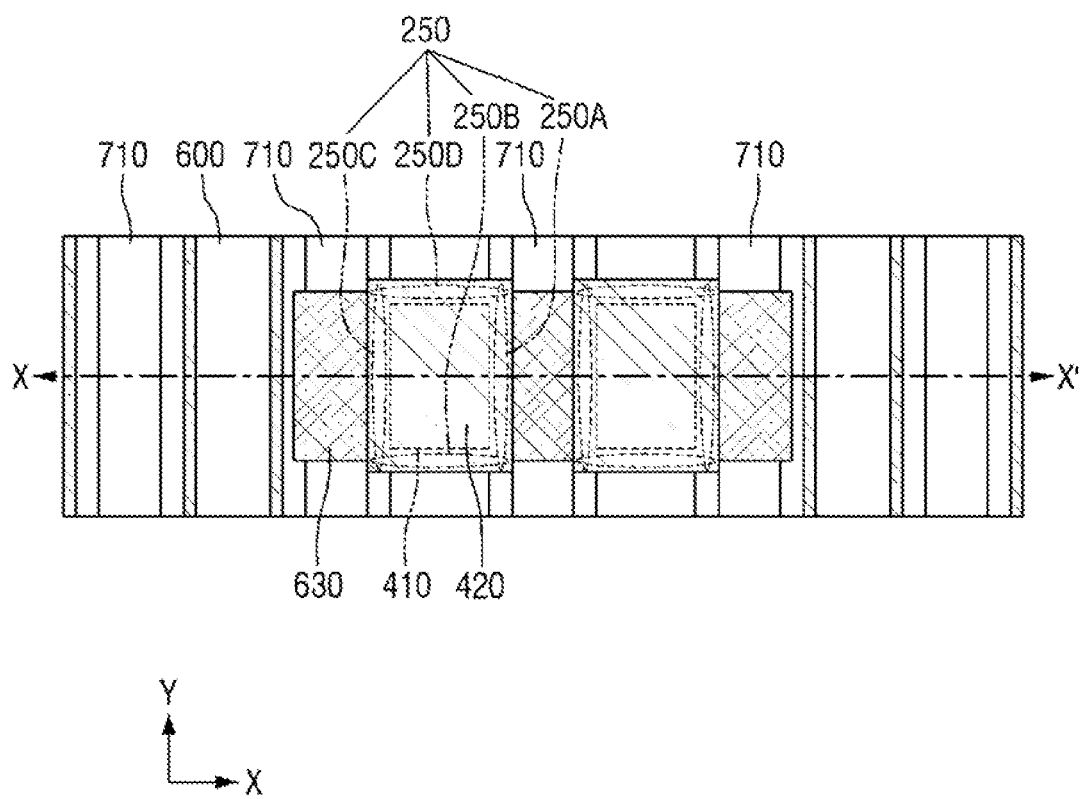

SEMICONDUCTOR DEVICE AND METHOD OF FABRICATING THE SAME

CROSS-REFERENCE TO RELATED APPLICATION

This application claims the benefit under 35 U.S.C. §119 (e) to U.S. Provisional Patent Application No. 62/271,674, filed on Dec. 28, 2015 in the United States Patent & Trademark Office, the disclosure of which is incorporated by reference herein in its entirety.

TECHNICAL FIELD

The present inventive concept relates to a semiconductor device and a method of fabricating the same.

DISCUSSION OF RELATED ART

For higher densities in integrated circuit applications, fabrication processes have evolved to reduce the minimum feature sizes of circuit elements such as the gate electrode and source/drain electrodes of transistors. As the feature sizes have decreased, distances between the circuit elements also reduce, and thus electrical shorts between the circuit elements may occur according to process variations of the fabrication processes.

SUMMARY

According to an exemplary embodiment of the present inventive concept, a method of fabricating a semiconductor device is provided as follows. An active fin structure and an isolation region is formed on a substrate. An epitaxial layer is formed on the active fin structure. A first metal gate electrode and a second metal gate electrode are formed on the active fin structure. A first gate electrode cap and a second gate electrode cap are formed on upper surfaces of the first and second metal gate electrodes, respectively. A first metal gate spacer and a second metal gate spacer are formed on a first sidewall of the first metal gate electrode and a first sidewall of the second metal gate electrode, respectively. The first sidewall of the first metal gate electrode and the first sidewall of the second metal gate electrode face each other. The epitaxial layer is interposed between the first metal gate spacer and the second metal gate spacer. A source/drain electrode is formed on the epitaxial layer and between the first and second metal gate spacers. An air spacer region is formed by removing the first and second metal gate electrode caps and the first and second metal gate spacers. First and second air spacers are formed within the air spacer region. The first air spacer is interposed between the source/drain electrode and the first metal gate electrode. The second air spacer is interposed between the source/drain electrode and the second metal gate electrode.

According to an exemplary embodiment of the present inventive concept, a method of fabricating a semiconductor device is provided as follows. An active fin structure and an isolation region are formed on a substrate. A first dummy gate electrode and a second dummy gate electrode are formed on the active fin structure. A first dummy gate spacer and a second dummy gate spacer are formed on a first sidewall of the first dummy gate electrode and a first sidewall of the second dummy gate electrode, respectively. The first sidewall of the first dummy gate electrode and the first sidewall of the second dummy gate electrode face each other. An epitaxial layer is formed on the active fin structure and between the first and second dummy gate spacers. The first and second dummy gate spacers are removed. The first and second dummy gate electrodes are replaced with first and second metal gate electrodes, respectively. A first metal gate spacer and a second metal gate spacer are formed on a first sidewall of the first metal gate electrode and a first sidewall of the second metal gate electrode, respectively. A source/drain electrode is formed between the first metal gate spacer and the second metal gate spacer and on the epitaxial layer. The first and second metal gate spacers are replaced with an air spacer. The air spacer is interposed between the source/drain electrode and the first metal gate spacer and between the source/drain electrode and the second metal gate spacer.

According to an exemplary embodiment of the present inventive concept, a semiconductor device is provided as follows. A substrate has an active fin structure and an isolation region. A first metal gate electrode and a second metal gate electrode are disposed on the active fin structure. A source/drain electrode is interposed between the first metal gate electrode and the second gate metal electrode. The source/drain electrode includes an upper portion having a first width and a lower portion having a second width smaller than the first width. An air spacer surrounds the lower portion of the source/drain electrode. The air spacer is disposed under the upper portion of the source/drain electrode, wherein the air spacer is interposed between the first metal gate electrode and the lower portion of the source/drain electrode and between the second metal gate electrode and the lower portion of the source/drain electrode.

BRIEF DESCRIPTION OF DRAWINGS

These and other features of the present inventive concept will become more apparent by describing in detail exemplary embodiments thereof with reference to the accompanying drawings of which:

FIGS. 2A to 17A show plan views of the semiconductor device formed according to the flowchart of FIG. 1;

FIGS. 2B to 17B show cross-sectional views taken along X-X' of FIGS. 2A to 17A;

Figure 1:
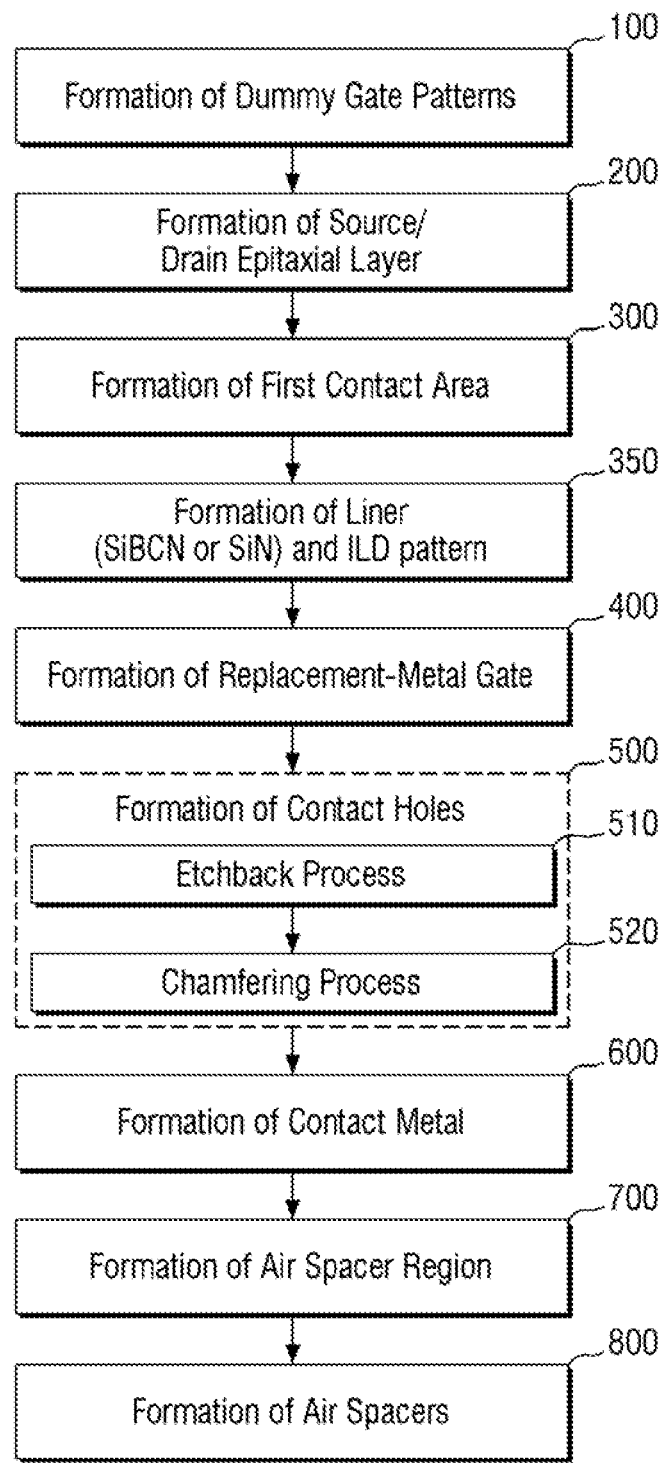
FIG. 1 is a flowchart of fabricating a semiconductor device according to an exemplary embodiment of the present inventive concept.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present.

Hereinafter, a method of fabricating a semiconductor device will be described with reference to FIG. 1, FIGS. 2A to 17A, and FIGS. 2B to 17B. FIG. 1 is a flowchart of fabricating a semiconductor device according to an exemplary embodiment of the present inventive concept. FIGS. 2A to 17A show plan views of the semiconductor device formed according to the flowchart of FIG. 1. FIGS. 2B to 17B show cross-sectional views taken along X-X' of FIGS. 2A to 17A. For example, the semiconductor device may include a transistor having an air spacer between a gate electrode and a source/drain electrode. The air spacer may serve as an electrical isolation between the gate electrode and the source/drain electrode.

Figure 2B:
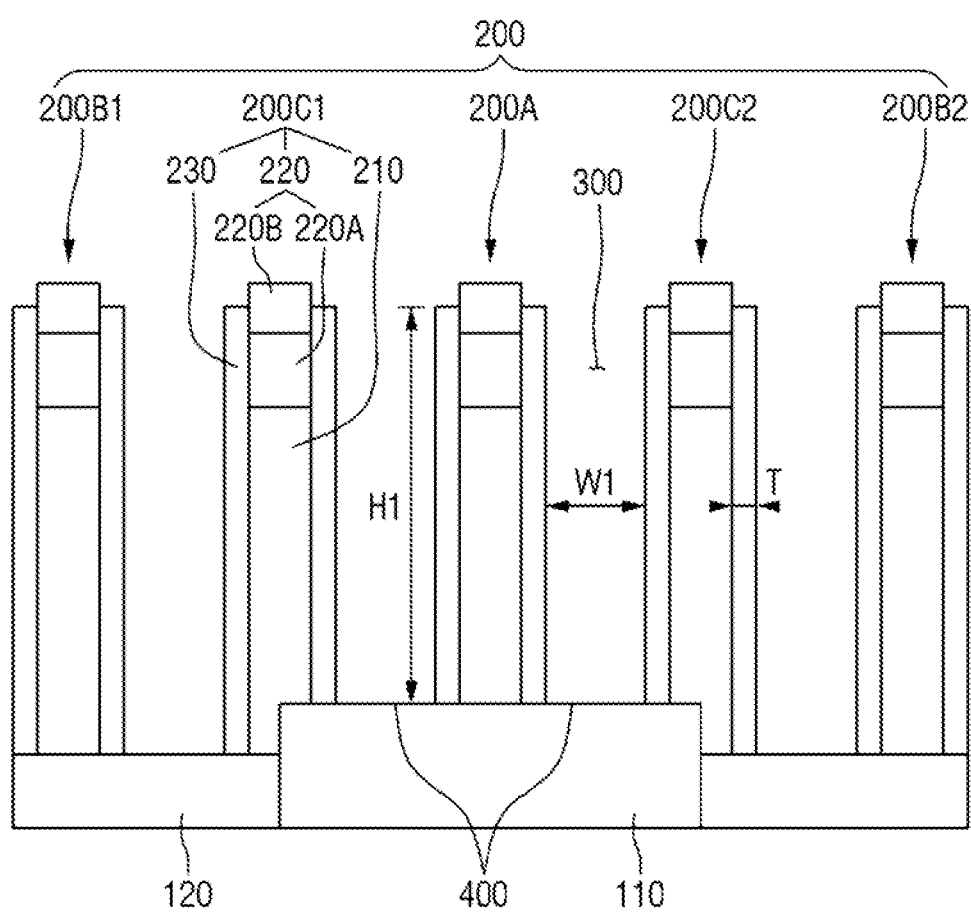

FIG. 2A is a plan view of a plurality of dummy gate patterns formed on a substrate after step 100 of FIG. 1 is performed according to an exemplary embodiment of the present inventive concept. FIG. 2B is a cross-sectional view of FIG. 2A taken along line X-X' according to an exemplary embodiment of the present inventive concept.

Referring to FIGS. 2A and 2B, a substrate 100 may be formed of a semiconductor material including silicon or a silicon-germanium alloy. In an exemplary embodiment, the substrate 100 includes an active fin structure 110 and an isolation region 120. The active fin structure 110 protrudes from the isolation region 120. The active fin structure 110 is extended in a first direction (x-axis), and is surrounded by the isolation region 120. An upper surface of the active fin structure 110 is higher than an upper surface of the isolation region 120.

The active fin structure 110 is a part of a transistor and serves to provide a channel region through which a current flows in response to a gate voltage applied to the transistor.

A plurality of dummy gate structures 200 is formed on the substrate 100. The dummy gate structures 200 include a first dummy gate structure 200A. The first dummy gate structure 200A extended in a second direction (y-axis) and crosses the active fin structure 110. A pair of source/drains (not shown here) is formed on both sides of the first dummy gate structure 200A by doping impurity atoms into the contact regions 400 using an ion-implantation process or a diffusion process. The source/drains are formed in the contact regions 400 of the active fin structure 110. In an exemplary embodiment, source/drain contacts and source/drain electrodes will be formed on the source/drains. The first dummy gate structure 200A will become a transistor after performing a fabricating method of a semiconductor device according to an exemplary embodiment.

The dummy gate structures 200 also include second dummy gate structures 200B1 and 200B2 on the isolation region 120. The second dummy gate structures 200B1 and 200B2 do not function as transistors. For the convenience of description, a limited region of a semiconductor device is shown in the drawings. The second dummy gate structures 200B1 and 200B2 may further extend and cross another active fin structure (not shown here). In this case, the overlap region of the second dummy gate structures 200B1 and 200B2 and the another active fin structure may form a transistor.

The dummy gate structures 200 also include third dummy gate structures 200C1 and 200C2 on end portions of the active fin structure 110. The third dummy gate structures 200C1 and 200C2 are formed on boundaries between the active fin structure 110 and the isolation region 120. For example, the dummy gate structures 200 are disposed on both the active fin structure 110 and the isolation region 120.

The third dummy gate structures 200C1 and C2 do not function as transistors. For the convenience of description, a limited region of a semiconductor device is shown in the drawings. The third dummy gate structures 200C1 and 200C2 may further extend and cross another active fin structure (not shown here) to form a transistor.

For the convenience of descriptions, the active fin structure 110 is overlapped with three dummy gate structures 200A, 200C1 and 200C2. The present inventive concept, however, is not limited thereto, and four or more dummy gate structures may overlap the active fin structure 110.

In an exemplary embodiment, each dummy gate structure 200 includes a dummy gate pattern 210, a mask pattern 220 and a dummy gate spacer 230.

A plurality of trenches 300 is formed between the dummy gate structures 200. For example, the trenches 300 are formed between two adjacent dummy gate spacers 230.

The dummy gate structures 200 are repeatedly arranged along the first direction in parallel to the x-axis, for example, and are spaced apart from each other in the first direction at a first pitch W1. In an exemplary embodiment, the first pitch W1 is a width of the trench 300. Each dummy gate structure 200 is extended in the second direction in parallel to the y-axis, for example. Each dummy gate structure 200 is erected at a first height H1 on the upper surface of the active fin structure 110 in a third direction in parallel to the z-axis. The first height H1 is a length measured between the upper surface of the active fin structure 110 and the upper surface of the dummy gate spacer 230.

Each trench 300 is formed between two adjacent dummy gate structures 200 so that each trench 300 is extended in the second direction. In this case, each trench 300 formed on the active fin structure 110 has an aspect ratio of the first pitch W1/the first height H1. The greater is the aspect ratio, the more difficult it is to form a source/drain electrode on the active fin structure 110 through the trench 300.

The dummy gate patterns 210 are formed on the substrate 100. In an exemplary embodiment, the dummy gate patterns 210 may be formed of an amorphous silicon or poly-silicon. The dummy gate pattern 210 will be replaced with a metal gate electrode using a replacement-metal-gate (RMG) process in a subsequent process.

The mask patterns 220 are formed on upper surfaces of the dummy gate patterns 210. Each mask pattern 220 includes a first mask pattern 220A and a second mask pattern 220B. The first mask pattern 220A is formed on the upper surface of the dummy gate pattern 210. The second mask pattern 220B is formed on an upper surface of the first mask pattern 220A.

In an exemplary embodiment, the mask patterns 220 are used as etch masks to form the dummy gate patterns 210 from a dummy gate layer (not shown here). Before the formation of the dummy gate patterns 210, the dummy gate layer is formed on the substrate 100, covering the substrate 100. In an etching process using the mask patterns 220 as etch masks, the dummy gate layer is patterned into the dummy gate patterns 210. In an exemplary embodiment, the etching process may include a directional etching process including a reactive ion etching (RIE) process.

In an exemplary embodiment, the first mask pattern 220A may be formed of silicon nitride; the second mask pattern 220B may be formed of silicon oxide. The present inventive concept is not limited thereto, and various materials may serve as an etch mask to pattern the dummy gate pattern layer into the dummy gate patterns 210.

The dummy gate spacers 230 are formed on sidewalls of the dummy gate patterns 210. Each dummy gate spacer 230 completely covers a sidewall of each dummy gate pattern 210 and a sidewall of each first mask pattern 220A, and partially covers a sidewall of each second mask pattern 220B. In an exemplary embodiment, a preliminary gate spacer layer (not shown here) may be conformally formed on the dummy gate patterns 210 and the mask patterns 220 using a deposition process. The preliminary gate spacer layer may cover completely the dummy gate patterns 210, the mask patterns 220 and the substrate 100. The deposition process may include a chemical vapor deposition (CVD) process. A directional etching process including, for example, an RIE process, may be performed on the preliminary gate spacer layer to form the dummy gate spacers 230. Due to the directionality of etch gases in the RIE process, the dummy gate spacers 230 remain on the sidewalls of the dummy gate patterns 210 after the RIE process is completed.

In an exemplary embodiment, the dummy gate spacers 230 may be formed of SiBCN or SiN.

The dummy gate spacers 230 have the thickness T to define contact regions 400 of the active fin structure 110. Source/drain electrodes are formed on the contact regions 400 in a subsequent process. The dummy gate spacers 230 may be replaced with an air spacer in an exemplary embodiment. In this case, a width of the air spacer may be substantially equal to the thickness T of the dummy gate spacer 230 or less than the thickness T.

The thickness T of each dummy gate spacer 230 may be also set so that an air spacer is formed between a metal gate electrode and a source/drain electrode in a subsequent process. In an exemplary embodiment, the dummy gate spacer 230 may be replaced with an air spacer; the dummy gate pattern 210 may be replaced with the metal gate electrode; and the source/drain electrode is formed on the contact region 400. The formation of the air spacers will be described later. The metal gate electrode may be formed in an RMG process which will be described later.

The directions of FIGS. 2A and 2B are applicable to other drawings, unless otherwise specified, and thus the notations of axes x, y and z are omitted on the other drawings.

Figure 3A:
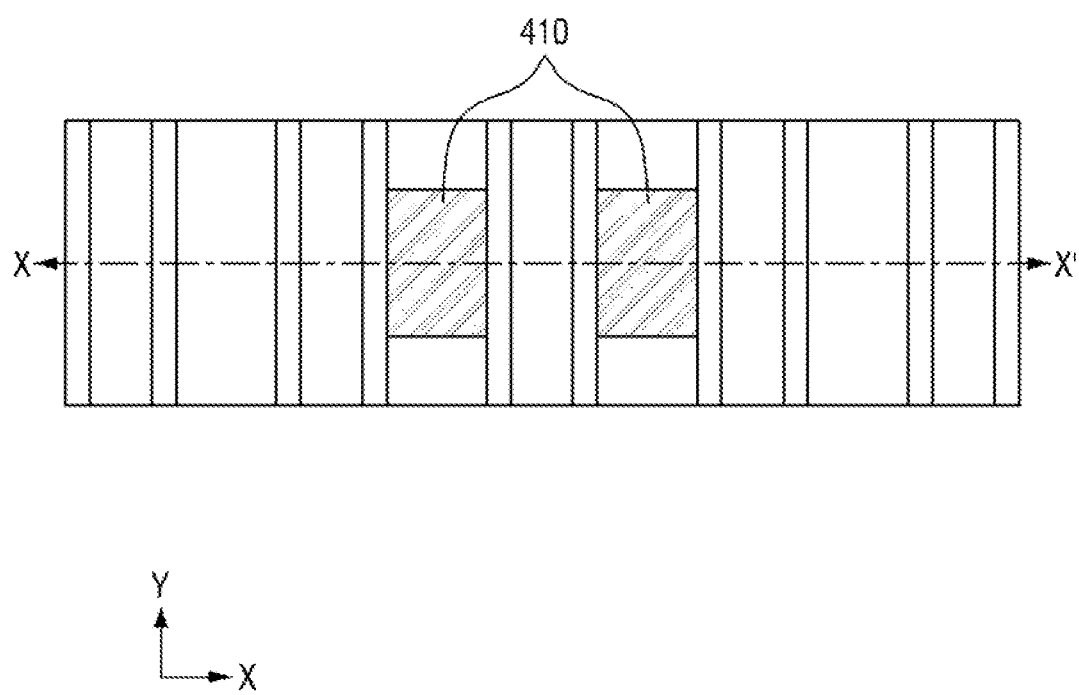
Figure 3B:
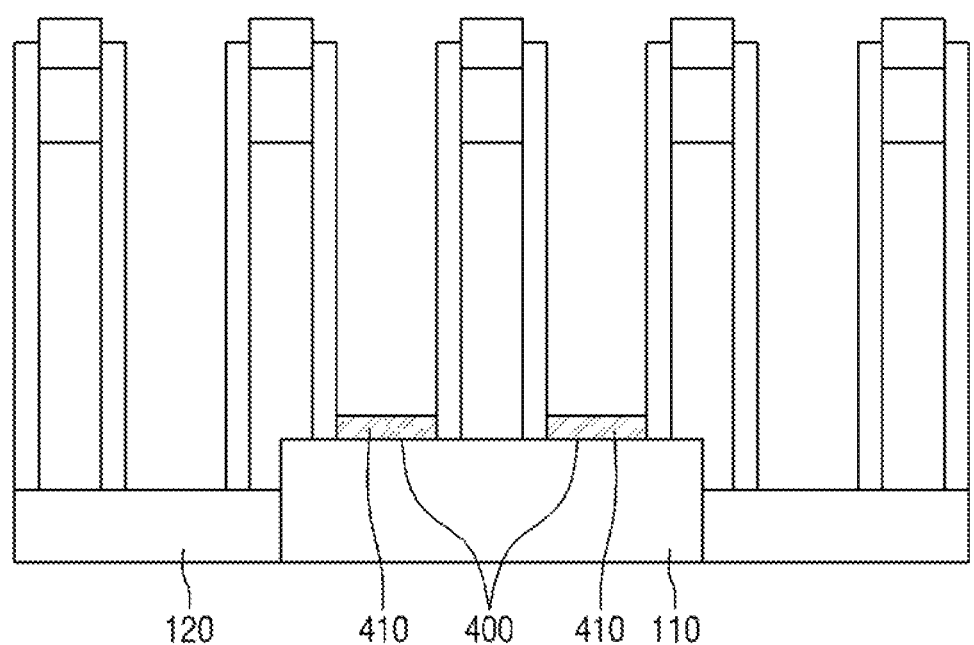

FIGS. 3A and 3B show an epitaxial layer 410 formed on the contact region 400 after step 200 of FIG. 1 is performed according to an exemplary embodiment of the present inventive concept. In an exemplary embodiment, the epitaxial layer 410 may be grown epitaxially using the upper surface of the active fin 110 as a seed layer; an epitaxial layer is not formed on the isolation region 120. In an exemplary embodiment, the isolation region 120 may be formed of silicon oxide. In an exemplary embodiment, impurity atoms may be doped in the epitaxial layer 410 by flowing the impurity atoms with the reactant gases. For example, the reactant gases may include $SiH_4$ or a mixture of $H_2/SiH_4$.

In an exemplary embodiment, the epitaxial layer 410 may be formed of silicon or a silicon germanium (SiGe) alloy. The epitaxial layer 410 may become a source/drain contact formed of metal silicide after a silicidation process is performed on the epitaxial layer 410. In the silicidation process, the epitaxial layer 410 may react with a source/drain electrode so that the source/drain contact is formed. The source/drain electrode may be formed on the epitaxial layer 410 and may be formed of metal. The source/drain contact may reduce contact resistance between the active fin structure 110 and the source/drain electrode.

Figure 4A:
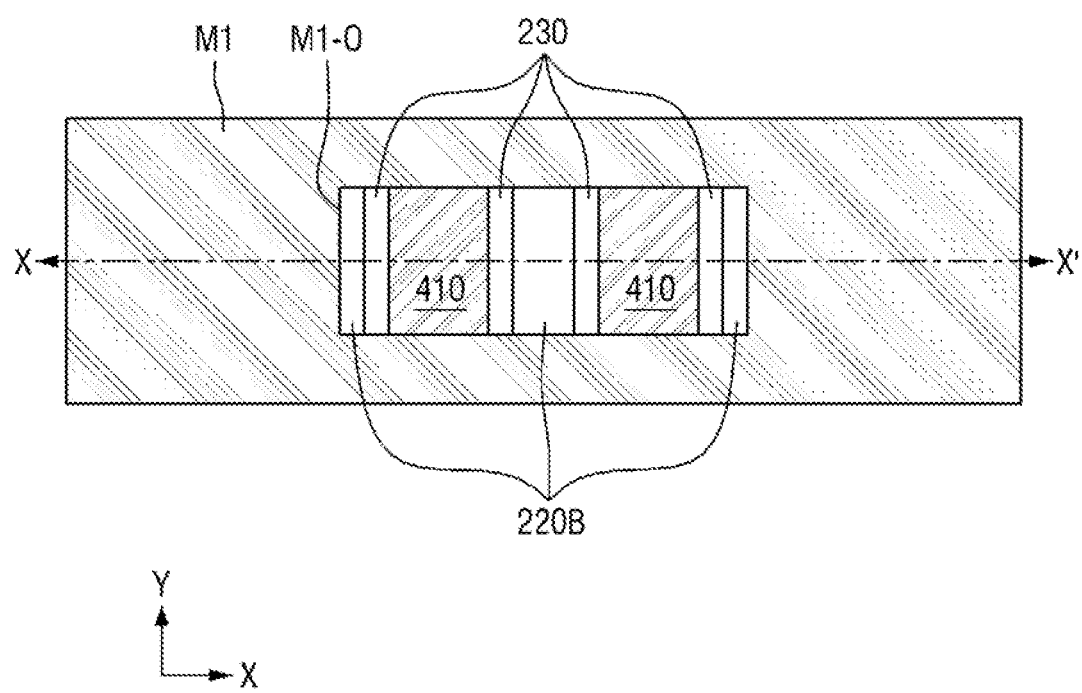
Figure 4B:
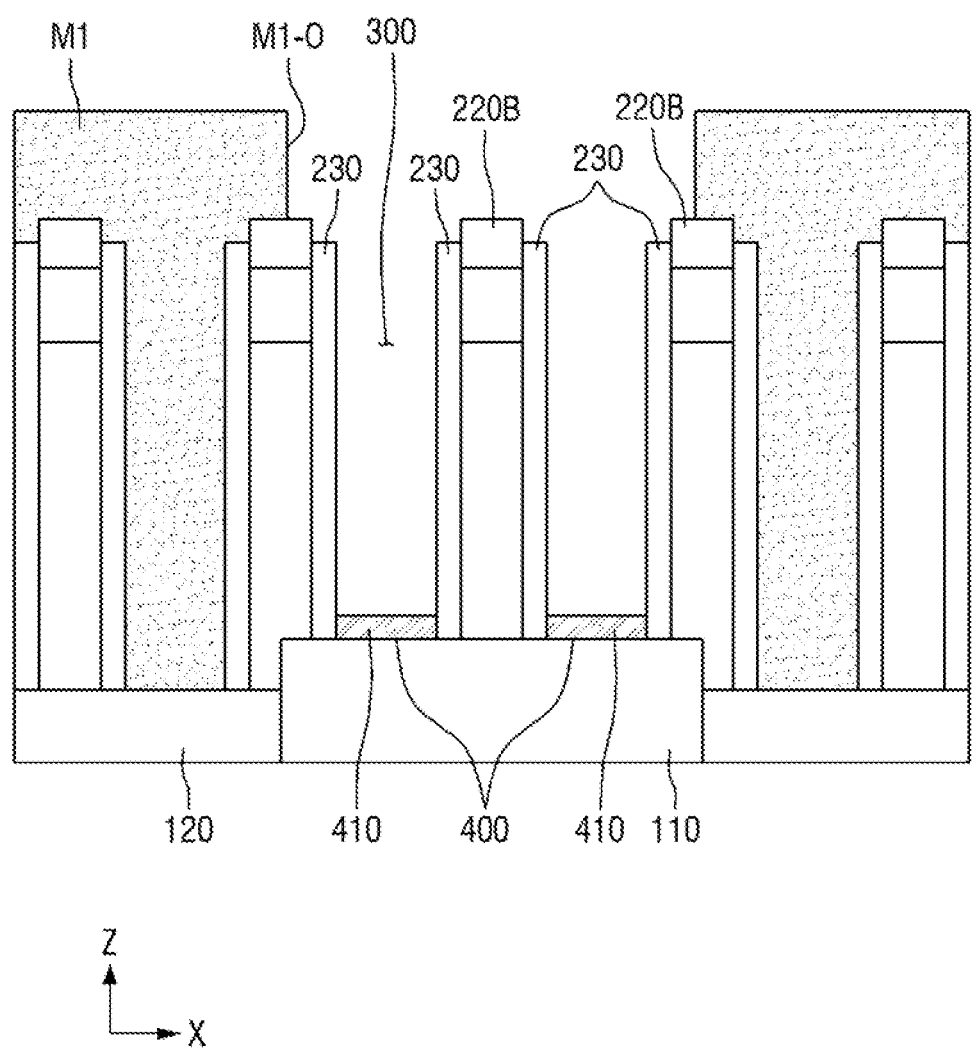

FIGS. 4A and 4B show a first mask M1 formed on the resulting structure of FIGS. 3A and 3B after step 300 of FIG. 1 is performed according to an exemplary embodiment of the present inventive concept. In an exemplary embodiment, the first mask M1 includes a mask opening M1-O which exposes the dummy gate spacers 230 and the epitaxial layers 410 formed on the active fin structure 110. The mask opening M1-O also exposes the second mask patterns 220B formed on the active fin structure 110. The second mask patterns 220B formed on end portions of the active fin structure 110 are partially exposed by the mask opening M1-O.

In an exemplary embodiment, the first mask M1 fill the trenches 300 formed on the isolation region 120.

In an exemplary embodiment, the first mask M1 may be formed of an organic type mask material including amorphous carbon, organo siloxane based materials with reflection control properties. The first mask M1 may be deposited by a CVD process or a spin-on process.

Figure 5A:
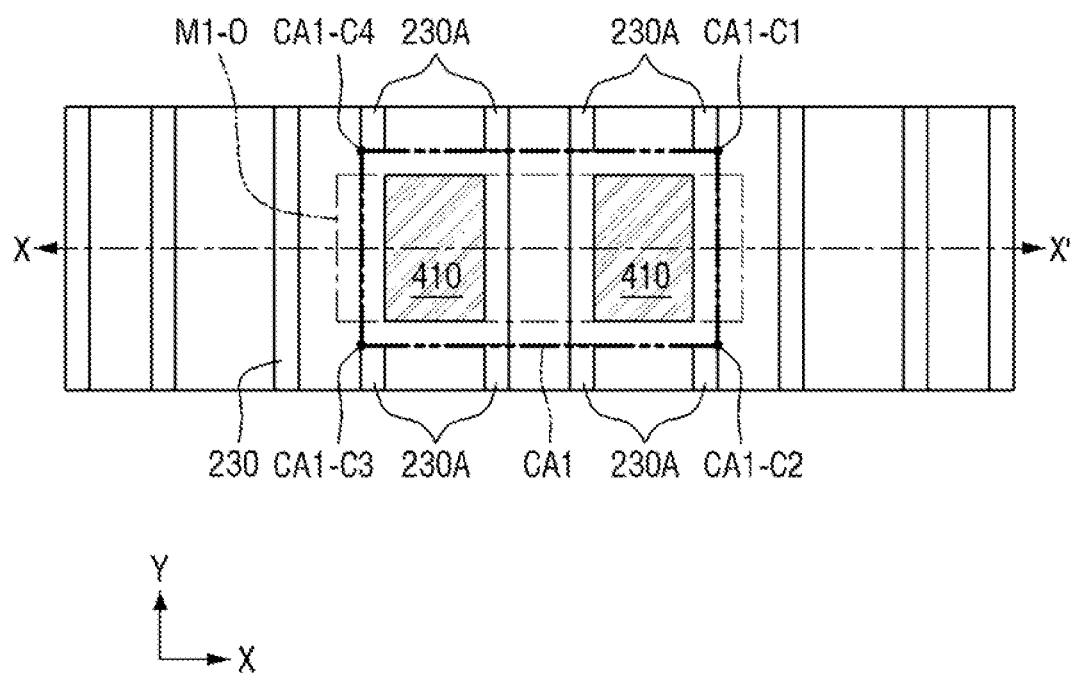
Figure 5B:
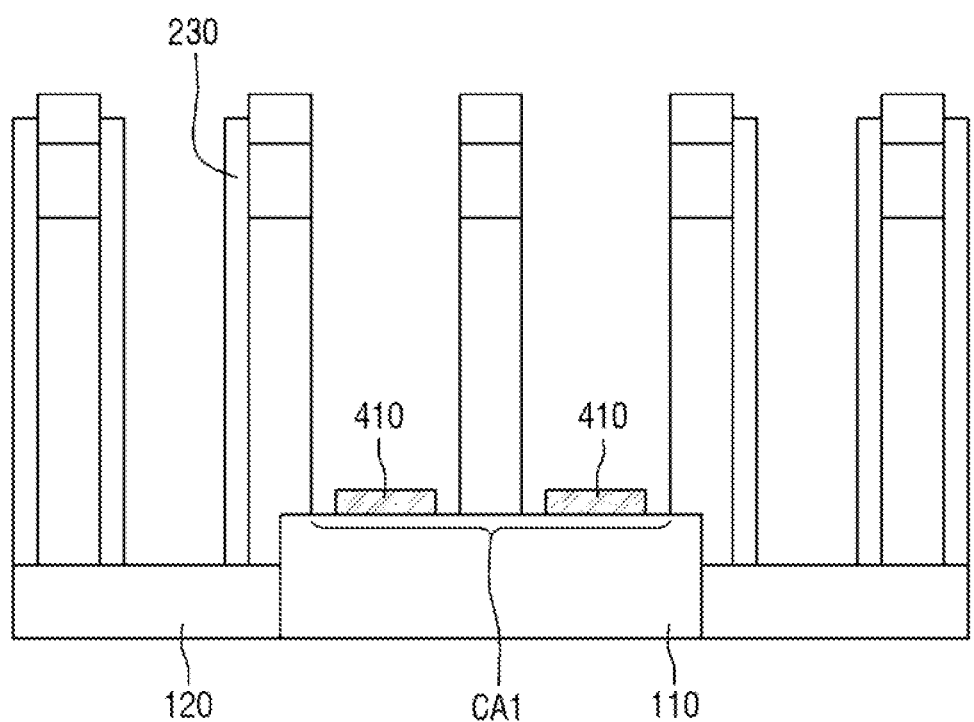

FIGS. 5A and 5B show a first contact area CA1 formed after step 300 of FIG. 1 is performed according to an exemplary embodiment of the present inventive concept. The first contact area CA1 is formed by removing the dummy gate spacers 230 formed on the active fin structure 110 and exposed by the mask opening M1-O.

In an exemplary embodiment, an isotropic etching process including a wet etching process or a dry etching process is performed on the resulting structure of FIGS. 4A and 4B. The first mask M1 serves as an etch mask. The dummy gate spacers 230 that are formed on the active fin structure 110 are removed through the mask opening M1-O. Etchants of the isotropic etching process may arrive at the dummy gate spacers 230 exposed by the mask opening M1-O of the first mask M1. The etchants may also arrive at the dummy gate spacers 230 under the first mask M1 as the dummy gate spacers 230 are receded along the second direction (y-axis) in the isotropic etching process.

In an exemplary embodiment, the dummy gate spacers 230 may be formed of SiN or SiBCN.

In an exemplary embodiment, the first contact area CA1 surrounds the epitaxial layers 410. The first contact area CA1 includes a space secured by removing the dummy gate spacers 230 through the opening M1-O of the first mask M1. The corners CA1-C1 to CA1-C4 of the first contact area CA1 defined by the intersection of the dummy gate pattern 210 and remaining dummy gate spacers 230A after the isotropic etching process is completed.

In an exemplary embodiment, air spacers (not shown here) will be formed within the first contact area CA1. Due to the isotropic etching process, parts of the dummy gate spacers 230 under the first mask M1 are also removed so that the second contact area CA1 is enlarged along the second direction (y-axis). Through the opening M1-O of the first mask M1, etchants may arrive at the dummy gate spacers 230 covered by the first mask M1, and the dummy gate spacers 230 of FIGS. 4A and 4B are isotropically etched. The dummy gate spacers 230 completely covered by the first mask M1 and disposed on the isolation region 120 remain after the isotropic etching process is completed.

Figure 6A:
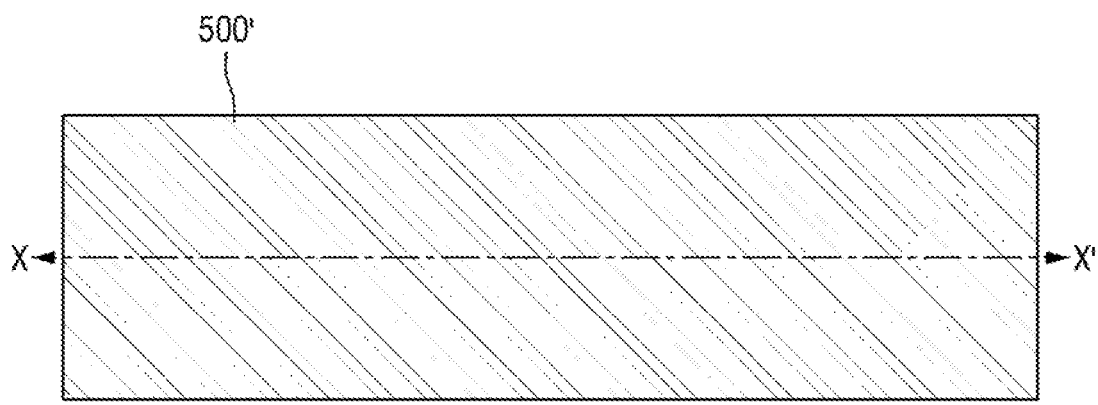
Figure 6A:
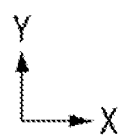
Figure 6B:
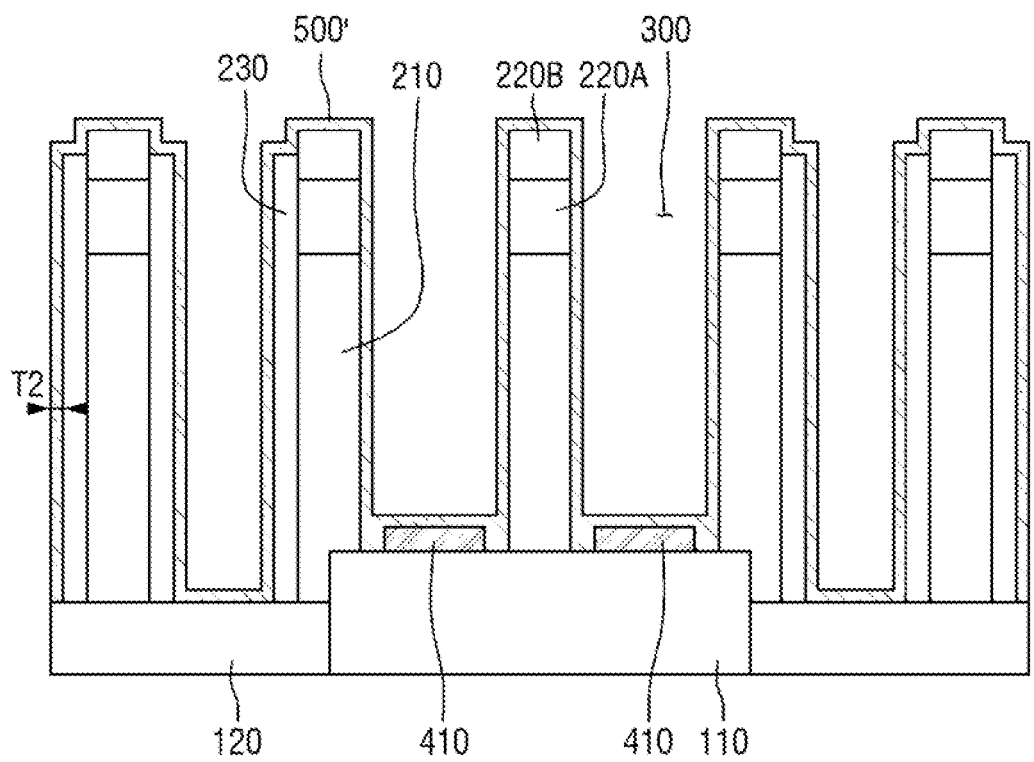

FIGS. 6A to 6B show a preliminary liner layer 500' formed on the resulting structure of FIGS. 5A and 5B after step 350 of FIG. 1 is performed according to an exemplary embodiment of the present inventive concept. In an exemplary embodiment, the preliminary liner layer 500' covers the dummy gate patterns 210. Before the formation of the preliminary liner layer 500', the sidewalls of the dummy gate patterns 210 are exposed, as shown in FIG. 5B, by removing the dummy gate spacers 230 formed on the active fin structure 110.

The preliminary liner layer 500' is also formed on sidewalls of the remaining dummy gate spacers 230A of FIGS. 5A and 5B.

The preliminary liner layer 500' may have a thickness T2 to the extent that the preliminary liner layer 500' does not fill the trenches 300, and to the extent that the preliminary liner layer 500' may protect a first interlayer dielectric (ILD) pattern in an RMG process. The first ILD patterns (not shown here) may completely fill the trenches 300 before the RMG process is performed.

In an exemplary embodiment, the preliminary liner layer 500' may be formed of SiBCN or SiN.

Figure 7B:
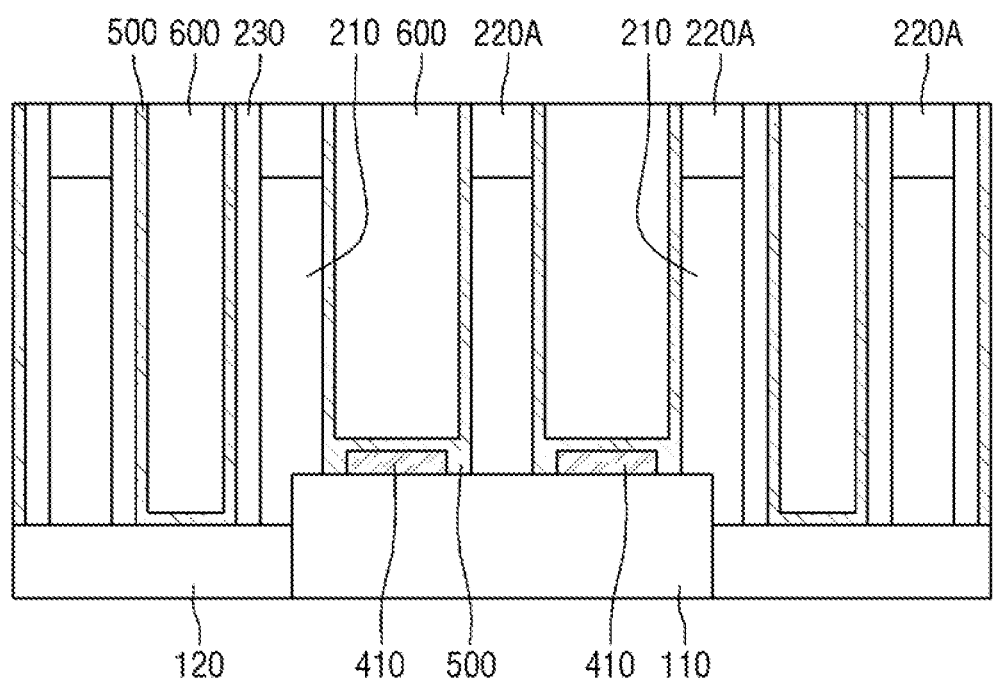

FIGS. 7A to 7B show first ILD patterns 600 after step 350 of FIG. 1 is performed according to an exemplary embodiment of the present inventive concept. In an exemplary embodiment, an ILD layer (not shown here) is formed on the liners 500 and the second mask patterns 220B of FIGS. 6A and 6B. The ILD layer may fill completely the trenches 300 of FIGS. 6A and 6B, completely covering the first and second mask patterns 220A and 220B. The ILD layer may be planarized using a planarizing process to form the first ILD patterns 600 and liners 500. For example, the planarizing process may include an etchback process or a chemically-mechanical polishing (CMP) process.

In an exemplary embodiment, after the planarizing process is completed, the second mask patterns 220B are removed and the first mask patterns 220A remain. Upper surfaces of the first mask patterns 220A may be coplanar with upper surfaces of the first ILD patterns 600.

In an exemplary embodiment, the preliminary liner layer 500' becomes the liners 500 after the planarization process. The liners 500 cover the sidewalls of the dummy gate electrodes 210 and the remaining dummy gate spacers 230A. The liners 500 also cover the epitaxial layers 410.

Figure 8A:
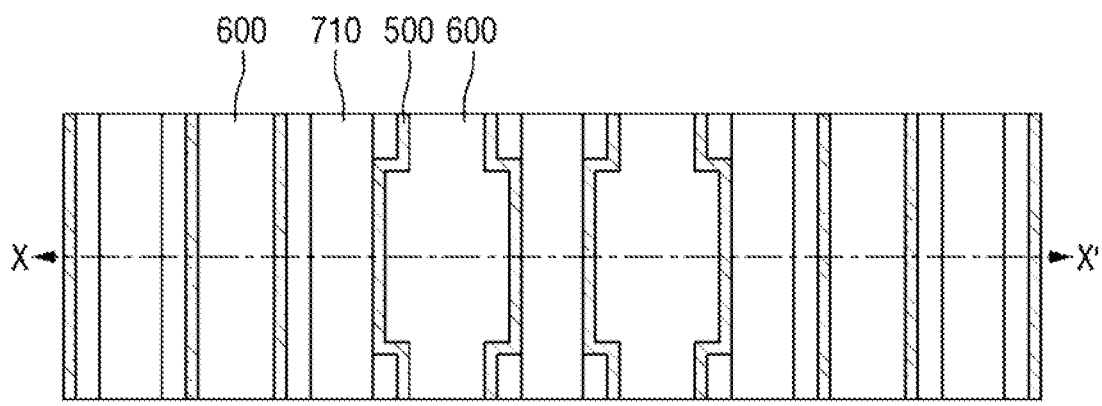
Figure 8A:
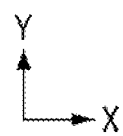
Figure 8B:
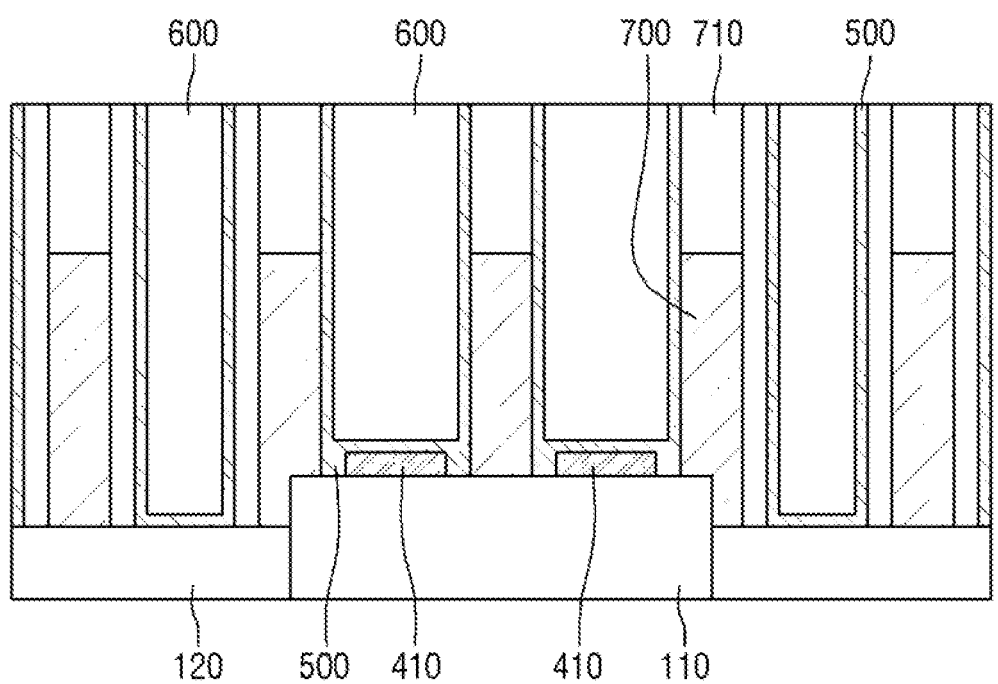

FIGS. 8A and 8B show a plurality of metal gate electrodes 700 formed after step 400 of FIG. 1 is performed according to an exemplary embodiment of the present inventive concept. An RMG process is performed on the resulting structure of FIGS. 7A and 7B. In the RMG process, the first mask patterns 220A and the dummy gate patterns 210 may be removed and then the metal gate electrodes 700 are formed on the substrate 100 in place of the dummy gate patterns 210 of FIG. 7B.

In an exemplary embodiment, the metal gate electrodes 700 may be formed of Al, W or Cu.

A plurality of gate electrode caps 710 is formed on upper surfaces of the metal gate electrodes 700. In an exemplary embodiment, the gate electrode caps 710 may be formed of SiBCN or SiN.

In the RMG process, the liners 500 may protect the first ILD patterns 600 while the first mask patterns 220A and the dummy gate patterns 210 are removed. The first mask patterns 220A and the dummy gate patterns 210 are interposed between the dummy gate spacers 230 and the liners 500 as shown in FIG. 7B. The RMG process may be followed by a planarizing process including an etchback process or a CMP process. In this case, upper surfaces of the metal gate electrode caps 710, upper surfaces of the first ILD patterns 600 and upper surfaces of the liners 500 are coplanar with each other.

The formation of contact holes will be described with reference to FIGS. 9A to 13A and FIGS. 9B to 13B.

Figure 9A:
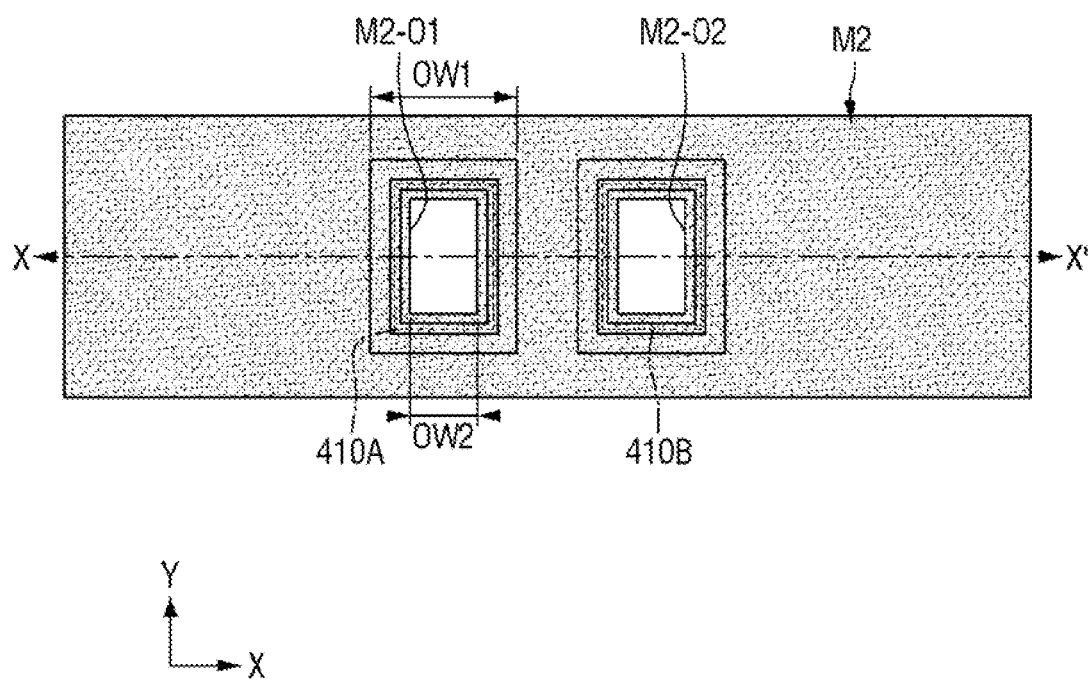
Figure 9B:
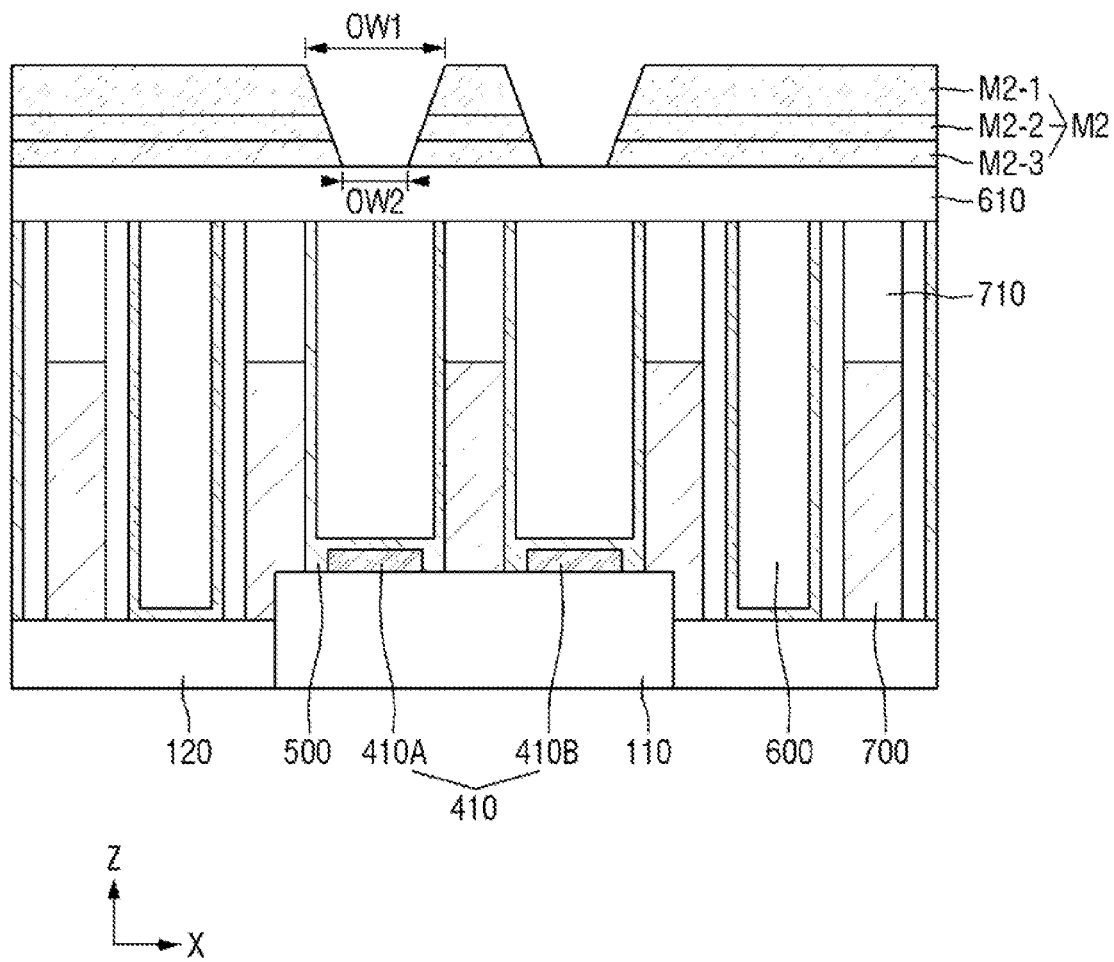

FIGS. 9A and 9B show a second mask M2 formed in step 500 is performed according to an exemplary embodiment of the present inventive concept. In an exemplary embodiment, the second mask M2 includes mask openings M2-O1 and M2-O2 to expose the epitaxial layers 410A and 410B, respectively. The width of the mask opening M2-O1 of the second mask M2 is smaller than the width of the epitaxial layer 410 in the first and second directions. In FIG. 9A, the epitaxial layer 410 is represented using dash lines. For example, the mask opening M2-O1 completely overlaps the epitaxial layer 410A in a plan view as shown in FIG. 9A; the mask opening M2-O2 completely overlaps the epitaxial layer 410B in a plan view as shown in FIG. 9A. The boundary of the epitaxial layer 410A is disposed within the mask opening M2-O1, and the boundary of the epitaxial layer 410B is disposed within the mask opening M2-O2.

In an exemplary embodiment, an oxide layer 610 may be formed on the resulting structure of FIGS. 8A and 8B before the second mask M2 is formed. The oxide layer 610 and the first ILD pattern 600 may be formed of the same material. The second mask M2 is formed on the oxide layer 610. In an exemplary embodiment, the first ILD pattern 600 may be formed of silicon oxide.

In an exemplary embodiment, the second mask M2 may have a single opening to expose the epitaxial layers 410A and 410B and the gate electrode cap 710 disposed between the epitaxial layers 410A and 410B.

In an exemplary embodiment, the second mask M2 includes a photoresist layer M2-1, an amorphous carbon layer M2-2 and a silicon anti-reflective coating (Si-ARC) layer M2-3. The photoresist layer M2-1 may be patterned to have a first opening width OW1, and then using at least one etching process, the amorphous carbon layer M2-2 and the Si-ARC layer M2-3 are etched to have a second opening width OW2 at the bottom of the mask openings M2-O1 and M2-O2. Using this method, the mask openings M2-O1 and M2-O2 may have the second opening width OW2 smaller than the first opening width OW1 which may be obtained using a photolithography equipment. For example, if the photolithography equipment uses an extreme ultraviolet (EUV) wavelength, the first opening width OW1 may be about 20 nm, and the second opening width OW2 may be about 12 nm. The present inventive concept is not limited thereto, and the widths OW1 and OW2 may have different sizes according to a photolithography equipment. Hereinafter, the first ILD patterns 600 and the oxide layer 610 may be collectively referred to as the first ILD patterns 600.

Figure 10B:
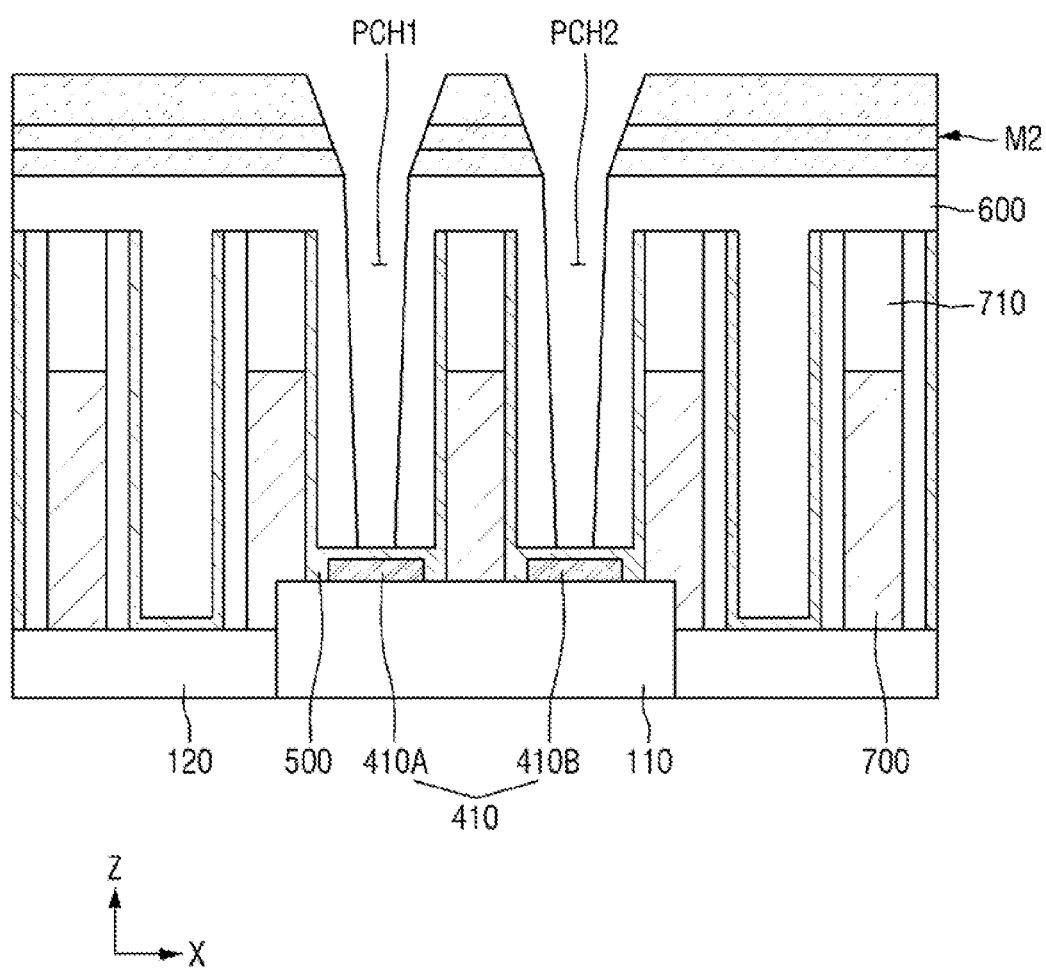

FIGS. 10A and 10B show first preliminary contact holes PCH1 and PCH2 formed on the contact regions 400. In an exemplary embodiment, the first ILD patterns 600 formed on the epitaxial layers 410 are etched using a directional etching process. In the directional etching process, the second mask M2 may be used as an etch mask to form the first preliminary contact holes PCH1 and PCH2 that are disposed on the active fin structure 110.

In an exemplary embodiment, the first preliminary contact holes PCH1 and PCH2 penetrate the first ILD patterns 600 so that the liners 500 formed on the active fin structure 110 are exposed through the first preliminary contact holes PCH1 and PCH2. The liners 500 may serve as an etch stopper in the directional etching process for the first ILD patterns 600. The epitaxial layers 410 may be protected by the liners 500 in the directional etching process for the first ILD patterns 600.

In an exemplary embodiment, the first preliminary contact holes PCH1 and PCH2 decrease downwardly in widths, and the exposed sidewalls of the first ILD patterns 600 are seen in the planar view of FIG. 10A through the mask openings M2-O1 and M2-O2 of the second mask M2.

Figure 11A:
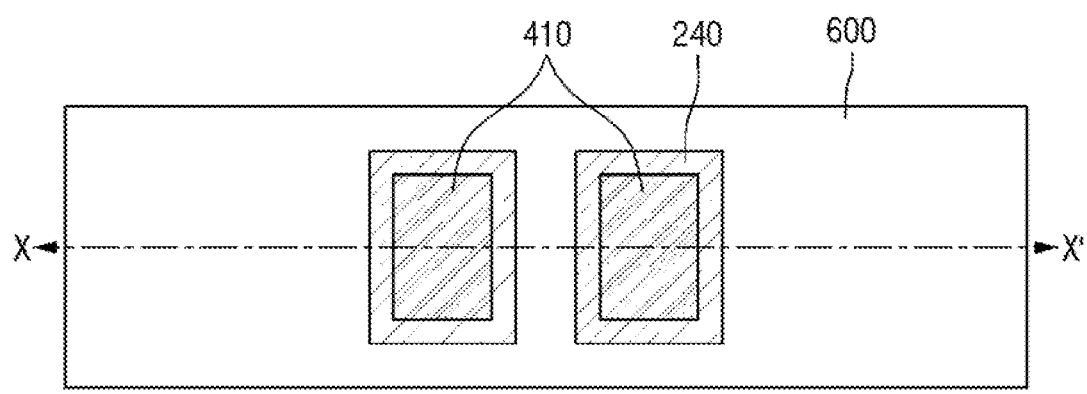
Figure 11A:
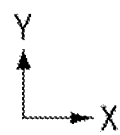
Figure 11B:
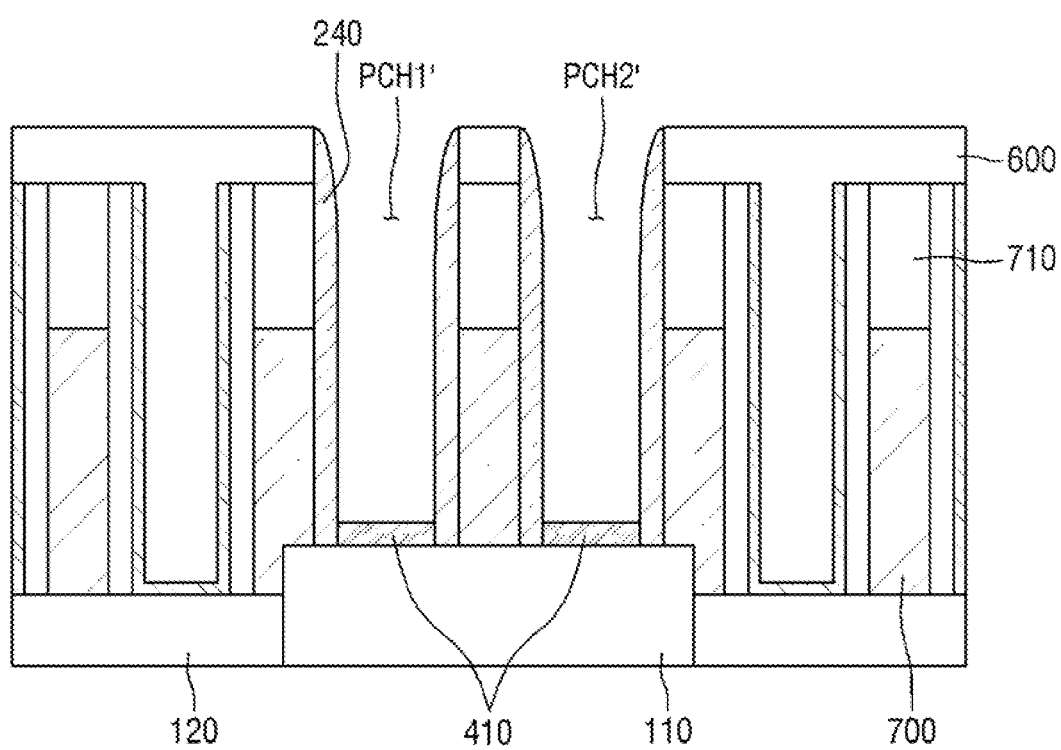

FIGS. 11A and 11B, a preliminary metal gate spacer 240 is formed on the active fin structure 110 using an etchback process performed in step 510 of FIG. 1. In an exemplary embodiment, before the etchback process of step 510 is performed, an isotropic etching process may be performed on the resulting structure of FIGS. 10A and 10B to remove the first ILD patterns 600 and the liners 500 through the first preliminary contact holes PCH1 and PCH2 of FIG. 10B. In an exemplary embodiment, the second mask M2 may be used as an etch mask for the isotropic etching process.

The first ILD patterns 600 of FIG. 10B may be removed in a wet etching using COR or Diluted HF as etchants. In this case, the liners 500 may serve as an etch stopper. The liners 500 may be removed in a wet etching process or a dry etching process using etchants having etch selectivity with respect to the metal gate electrodes 700, the gate electrode caps 710 and the epitaxial layers 410.

The first ILD patterns 600 that are disposed on the isolation region 120 remain after the isotropic etching process is performed.

After the isotropic etching process for removing the first ILD patterns 600 and the liners 500 formed on the active fin structure 110, a preliminary metal gate spacer layer (not shown here) may be conformally formed on the resulting structure of the isotropic etching process. In the isotropic etching process, the first ILD patterns 600 and the liners 500 are removed through the first preliminary contact holes PCH1 and PCH2 of FIG. 10B.

In an exemplary embodiment, the preliminary metal gate spacer layer is conformally formed without filling completely the first preliminary contact holes PCH1 and PCH2 of FIG. 10B, and then a directional etching process including an RIE process may be performed on the preliminary metal gate spacer layer to form the preliminary metal gate spacers 240 of FIG. 11B. This directional etching process may be referred to as an etchback process. In the etchback process, the preliminary metal gate spacer 240 is formed between the metal gate electrodes 700 and the epitaxial layers 410. The preliminary metal gate spacer 240 is formed on sidewalls of the metal gate electrodes 700 and the gate electrode caps 710 exposed by the isotropic etching process.

The second preliminary contact holes PCH1' and PCH2' are defined by the preliminary metal gate spacers 240 and the epitaxial layers 410. For example, the second preliminary contact holes PCH1' and PCH2' are surrounded by the preliminary metal gate spacers 240.

The formation of contact holes CH1 and CH2 using step 500 of FIG. 1 is described with reference to FIGS. 12A-13A and 12B-13B.

Figure 12A:
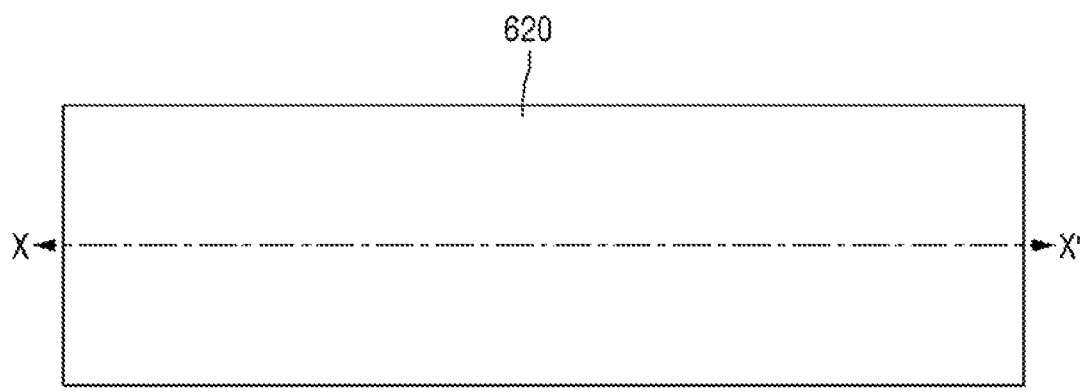
Figure 12A:
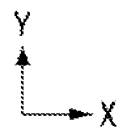
Figure 12B:
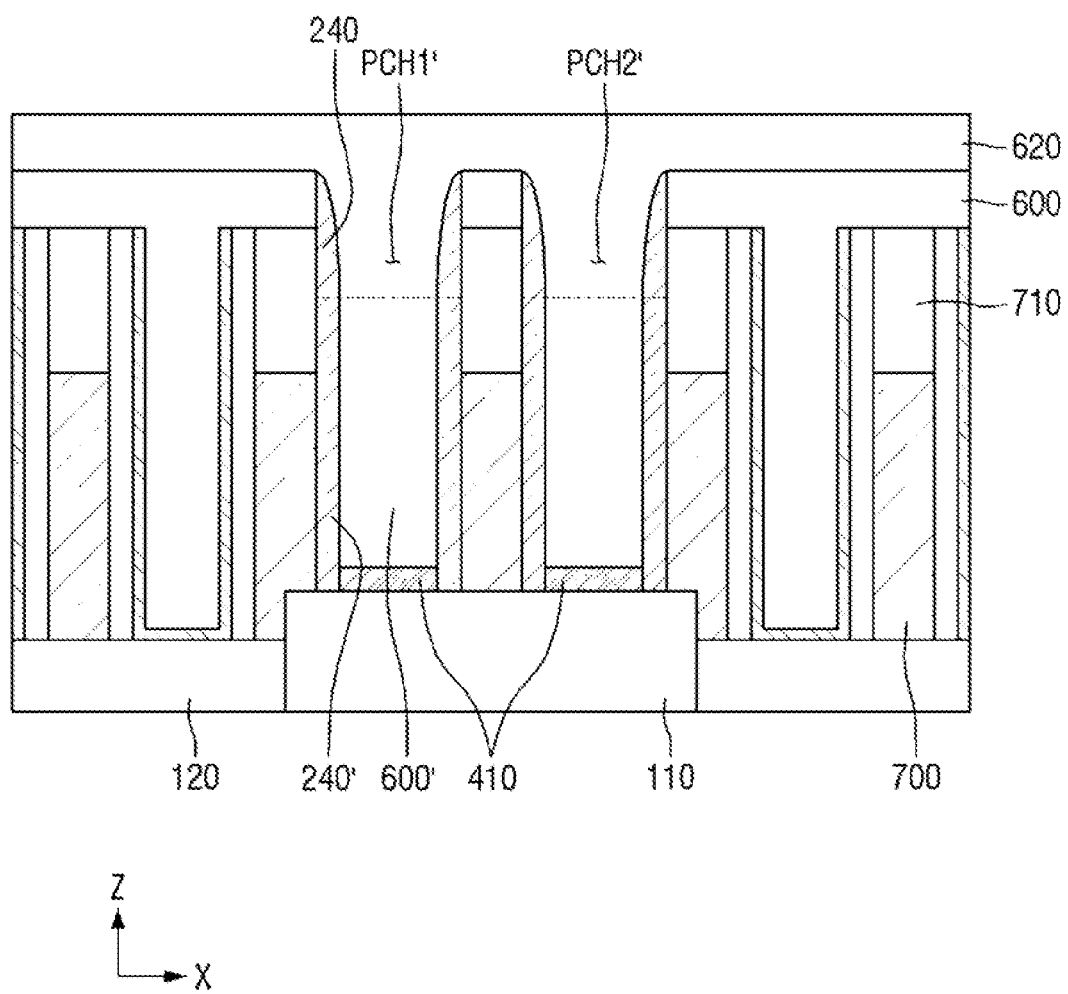

FIGS. 12A and 12B show an organic planarizing layer (OPL) 620 formed on the preliminary metal gate spacers 240. In an exemplary embodiment, the OPL 620 may formed using a spin-on coating process. The OPL 620 fills completely the second preliminary contact holes PCH1' and PCH2', as shown in FIG. 11B.

In an exemplary embodiment, a chamfering process of step 520 in FIG. 1 is applied on the OPL 620. In the chamfering process, the OPL 620 may be recessed to a predetermined depth, as indicated by dashed lines, in the second preliminary contact holes PCH1' and PCH2'. The chamfering process may be performed using an isotropic etching process to remove the OPL 620 and the preliminary metal gate spacer 240. Etchants of the isotropic etching process may have etch selectivity of the OPL 620 and the preliminary metal gate spacers 240 with respect to the IDL pattern 600. For example, the isotropic etching process may use oxygen plasma to remove the OPL 620.

In the chamfering process, metal gate spacers 240' and remaining OPL 600' remain only in the second preliminary contact holes PCH1' and PCH2'. And then, the remaining OPL 600' is removed to form contact holes CH1 and CH2 as shown in FIGS. 13A and 13B.

Figure 13A:
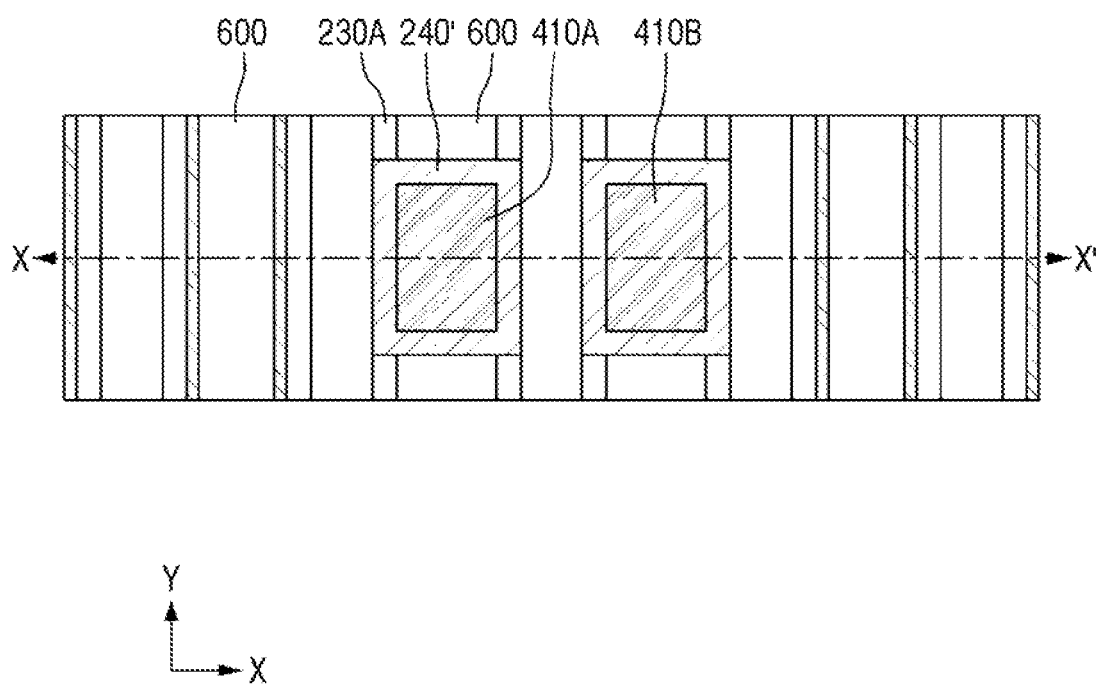
Figure 13B:
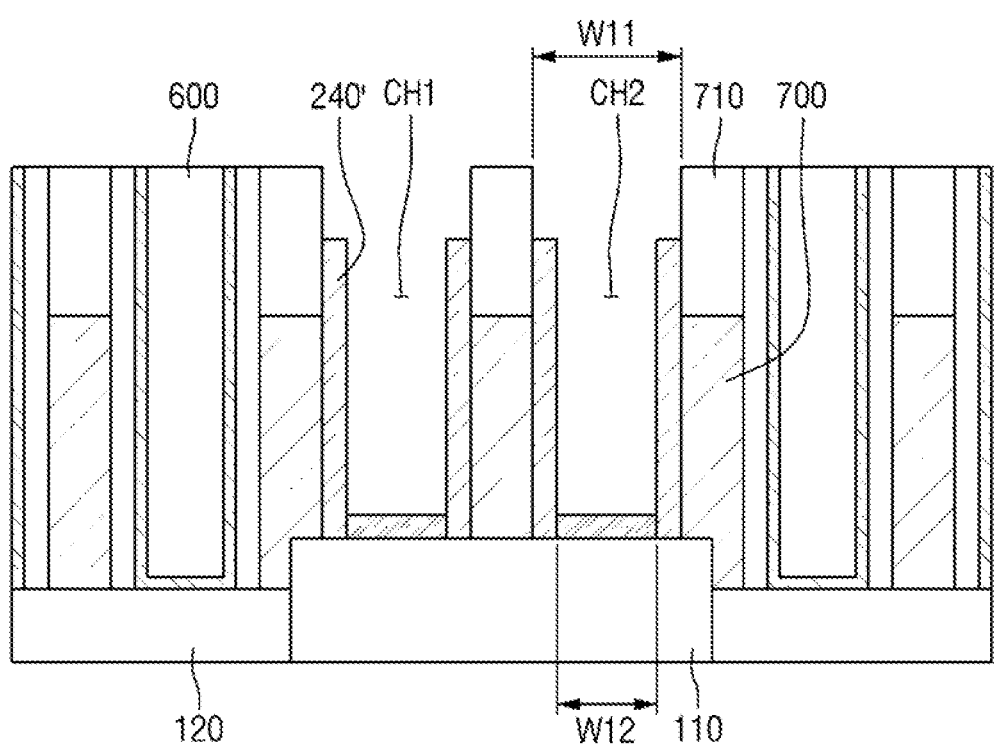

FIGS. 13A and 13B show contact holes CH1 and CH2 formed after step 500 of FIG. 1 is performed. The contact holes CH1 and CH2 have a first width W11 at upper portions of the contact holes CH1 and CH2 and a second width W12 at lower portions of the contact holes CH1 and CH2. The contact holes CH1 and CH2 are T-shaped to reduce the aspect ratio of the first contact holes CH1 and CH2. As shown in FIG. 13A, the epitaxial layers 410A and 410B are interposed between the metal gate spacers 240'; the metal gate spacers 240' cover sidewalls of the metal gate electrodes 700. The metal gate spacers 240' are in contact with the remaining dummy gate spacers 230A and the ILD patterns 600 interposed between the remaining dummy gate spacers 230A.

Figure 14A:
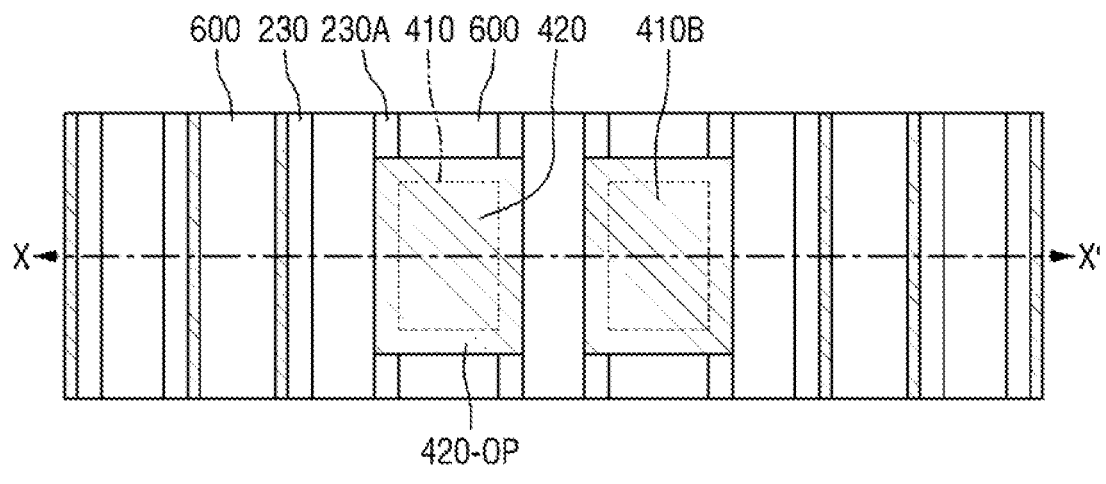
Figure 14B:
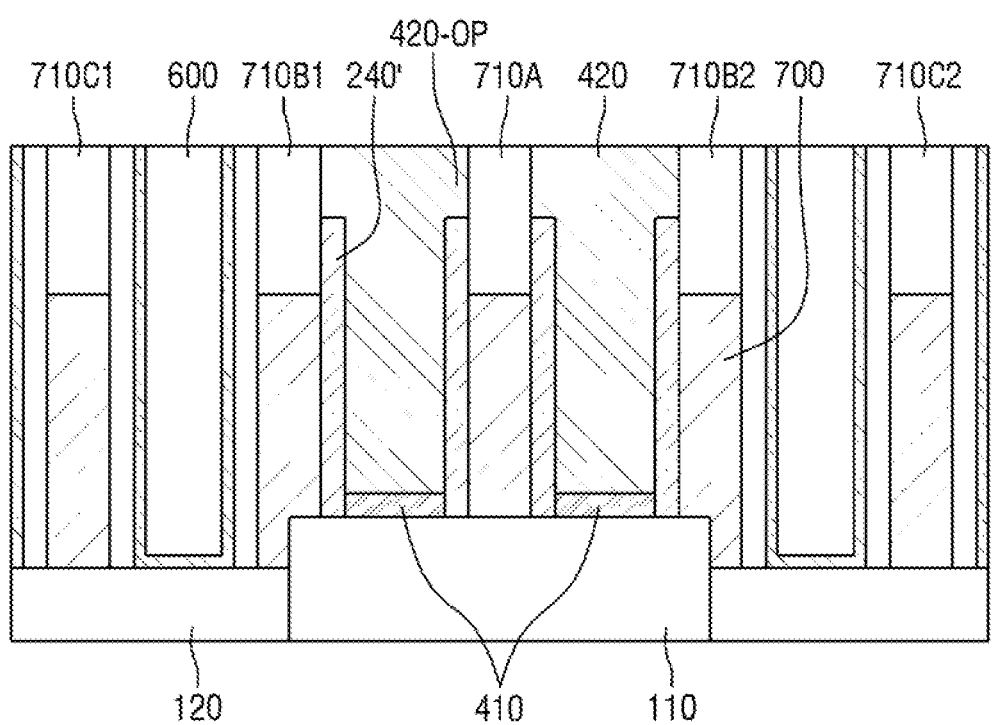

FIGS. 14A and 14B show source/drain electrodes 420 formed in the contact holes CH1 and CH2 after step 600 of FIG. 1 is performed according to an exemplary embodiment of the present inventive concept. In an exemplary embodiment, a metal layer (not shown here) may be formed on the resulting structure of the FIGS. 13A and 13B. The metal layer fills completely the contact holes CH1 and CH2. A planarizing process including an etchback process or a CMP process may be performed to form the source/drain electrodes 420. The planarized metal layers filled in the contact holes CH1 and CH2 become the source/drain electrodes 420. The source/drain electrodes 420 may be formed of metal including Al, W, or Cu. In an exemplary embodiment, the source/drain electrodes 420 may be formed of two or more metal layers stacked on each other. The source/drain electrodes 420 may further include Ti, Mo or Ta, for example.

The source/drain electrode 420 include a lower portion and an upper portion. For example, the lower portion is in contact with the epitaxial layer 410; the upper portion includes an overhang part 420-OP formed on the metal gate spacers 240'. In an exemplary embodiment, a silicidation process may be performed after the source/drain electrodes 420 are formed. For example, the source/drain electrodes 420 may react with the epitaxial layers 410 to form a silicide layer (not shown here) at the boundary between the source/drain electrodes 420 and the active fin structure 110. The silicide layer may reduce contact resistance between the source/drain electrode 420 and the active fin structure 110. The silicide layer may be referred to as a source/drain contact.

In an exemplary embodiment, the epitaxial layer 410 may be completely consumed to form the silicide layer. In an exemplary embodiment, the epitaxial layer 410 may be partially consumed to form the silicide layer. In this case, part of the epitaxial layer 410 may remain after the silicidation process is completed.

The formation of air-spacer regions will be described with reference to FIGS. 15A to 16A and FIGS. 15B to 16B.

Figure 15A:
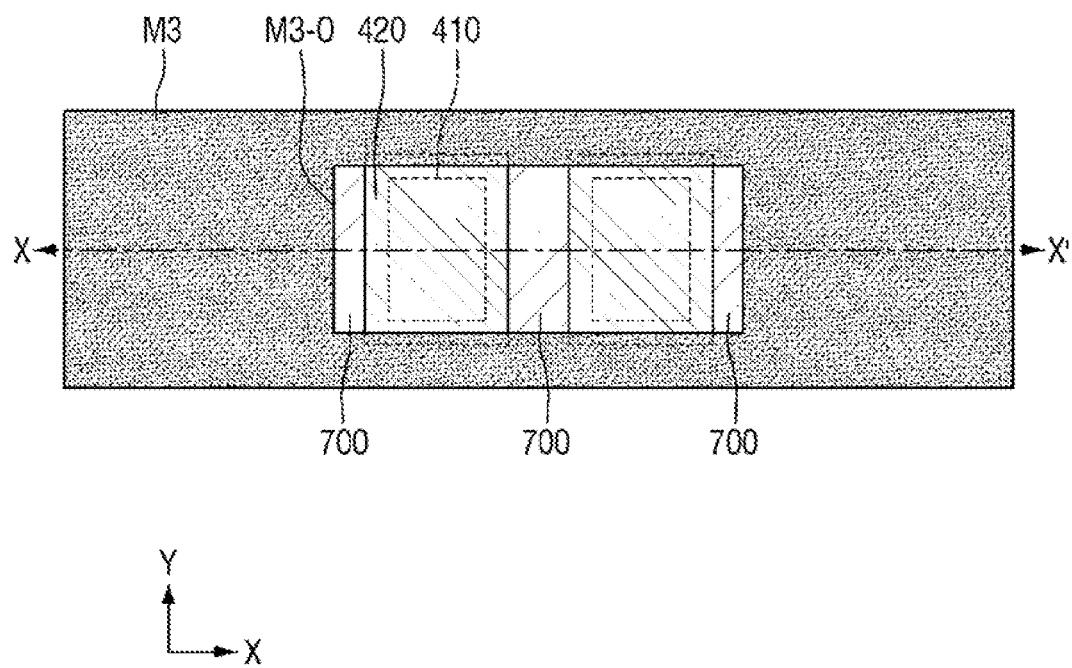
Figure 15B:
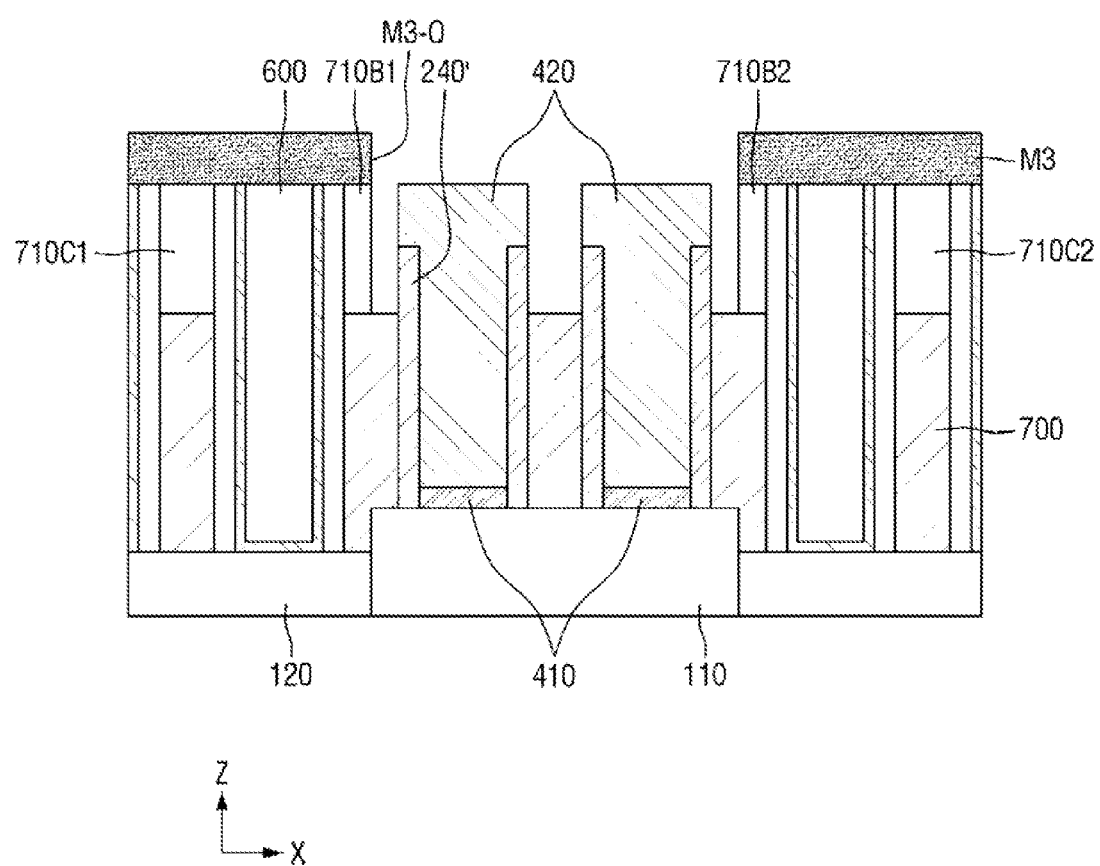

FIGS. 15A and 15B show a third mask M3 to define an air spacer region in the resulting structure of FIGS. 14A and 14B after step 700 of FIG. 1 is performed according to an exemplary embodiment of the present inventive concept. The third mask M3 includes a mask opening M3-O exposing an air spacer region ASR of FIG. 16B. The mask opening M3-O exposes the source/drain electrodes 420. The mask opening M3-O completely exposes a first gate electrode cap 710A of FIG. 14B interposed between the source/drain electrodes 420 formed on the active fin structure 110. The mask opening M3-O partially exposes second gate electrode caps 710B1 and 710B2 of FIG. 14B. The mask opening M3-O completely covers third electrode caps 710C1 and 710C2 of FIG. 14B that are disposed on the isolation region 120.

An anisotropic etching process may be performed on the resulting structure using the third mask M3 as an etch mask. The first gate electrode cap 710A is completely removed. The second gate electrode caps 710B1 and 710B2 are partially removed so that remaining second gate electrode caps 710B1' and 710B2' are formed on the active fin structure 110. The metal gate electrodes 700 formed on the active fin structure 110 are exposed through the mask opening M3-O. The metal gate spacers 240' are also exposed through the mask opening M3-O.

After the anisotropic etching process is performed, an isotropic etching process is performed to remove completely the remaining second gate electrode caps 710B1' and 710B2' and the metal gate spacers 240' disposed within the third mask opening M3-O.

Figure 16A:
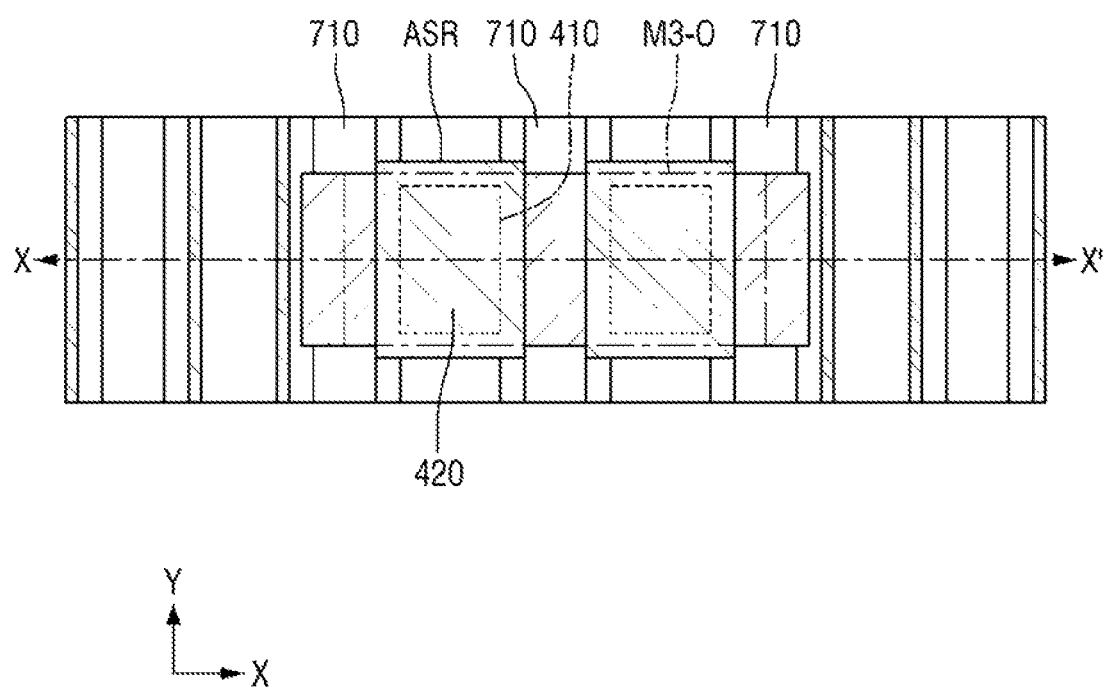
Figure 16B:
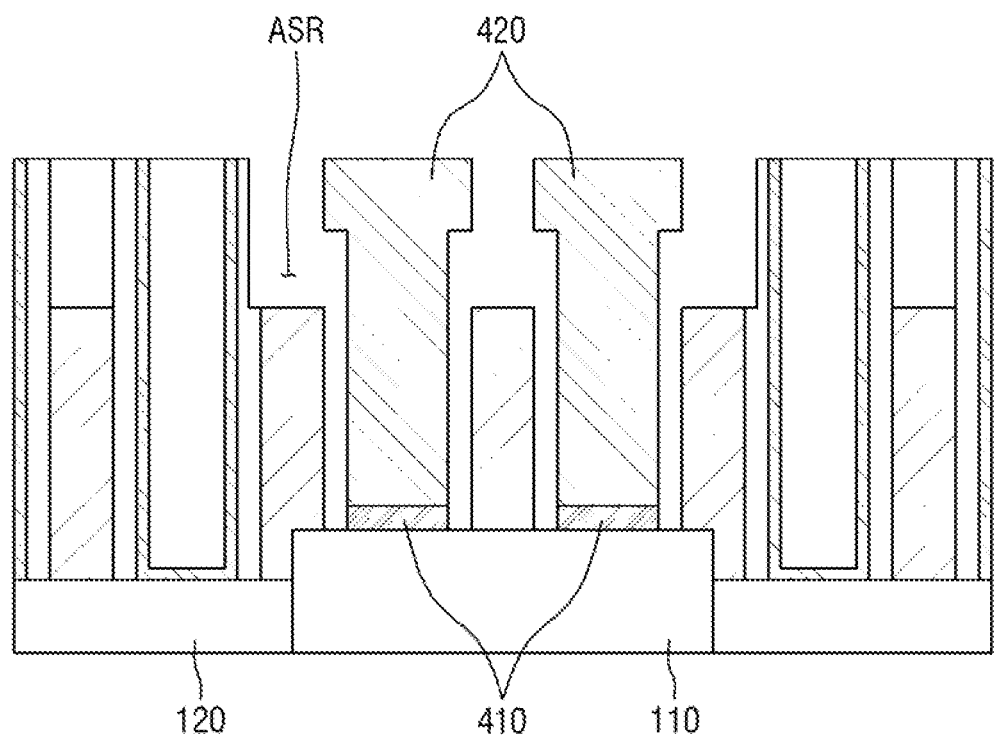

FIGS. 16A and 16B show the air spacer region ASR after step 700 of FIG. 1 is performed using two step etching processes including the anisotropic etching process and the isotropic etching process described above with reference to FIGS. 15A and 15B. The air spacer region ASR surrounds sidewalls of the source/drain electrodes 420.

Figure 17B:
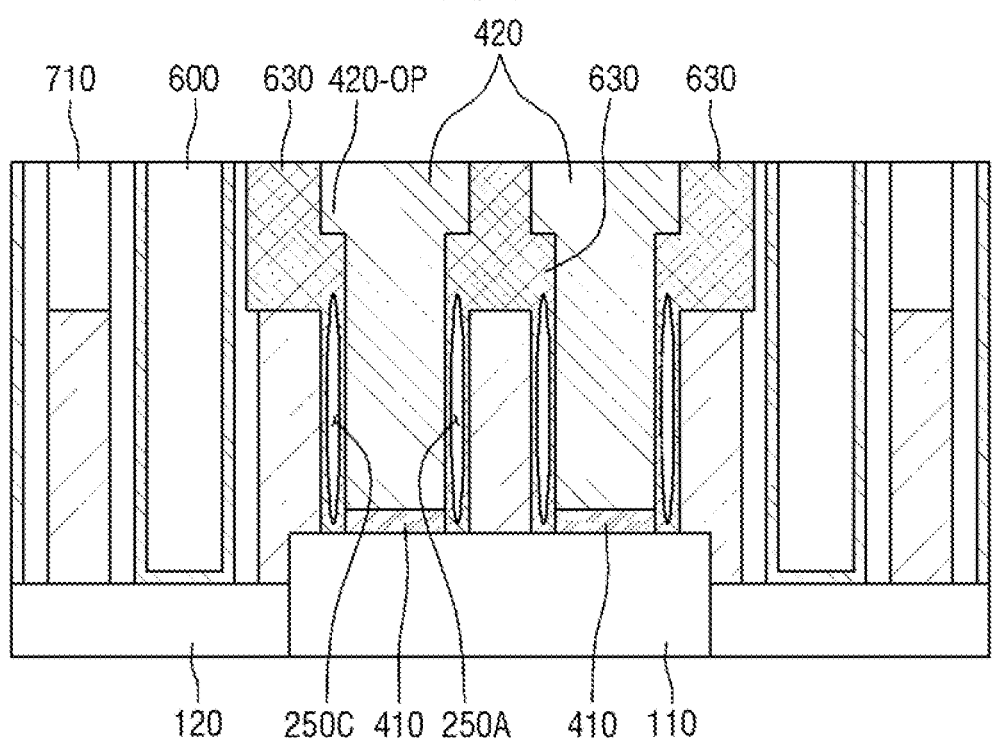

FIGS. 17A and 17B show an air spacer 250 formed after step 800 of FIG. 1 is performed according to an exemplary embodiment of the present inventive concept. Second ILD patterns 630 are formed in the air spacer regions ASR of FIGS. 16A and 16B using a deposition process. The deposition process for deposing the second ILD patterns 630 may be controlled so that the second ILD patterns 630 have voids. When viewed from the above as shown in FIG. 17A, the second ILD patterns 630 completely fill the air-spacer regions ASR. However, the second ILD patterns 630 have voids therein, and the voids correspond to the air spacer 250. Each air spacer 250 includes air spacers 250A to 250D that are formed on four sidewalls of each source/drain electrode 420. In an exemplary embodiment, the air spacers 250A to 250D may be connected to each other. In an exemplary embodiment, the air spacers 250A to 250D may be spaced apart from each other.

The air spacers 250A to 250D are disposed under the overhang part 420-OP of the T-shaped source/drain electrode 420.

In an exemplary embodiment, the second ILD patterns 630 are formed on the active fin structure 110, and the first ILD patterns 600 are formed on the isolation regions 120. In an exemplary embodiment, the second ILD pattern 630 may be formed of a low-k ILD material of which a dielectric constant is smaller than a dielectric constant of the first ILD pattern 600. For example, the second ILD pattern 630 is formed of a low-k ILD material including organic silica glasses (OSG), and the first ILD pattern 600 is formed of silicon oxide. The second ILD pattern 630 may be referred to as a low-k ILD pattern.

In an exemplary embodiment, the gate electrode caps 710 are formed on the isolation regions 120, and the second ILD patterns 630 are formed on the active fin structure 110. For example, the metal gate electrodes 700 formed on the active fin structure 110 are covered by the second ILD patterns 630.

Figure 18:
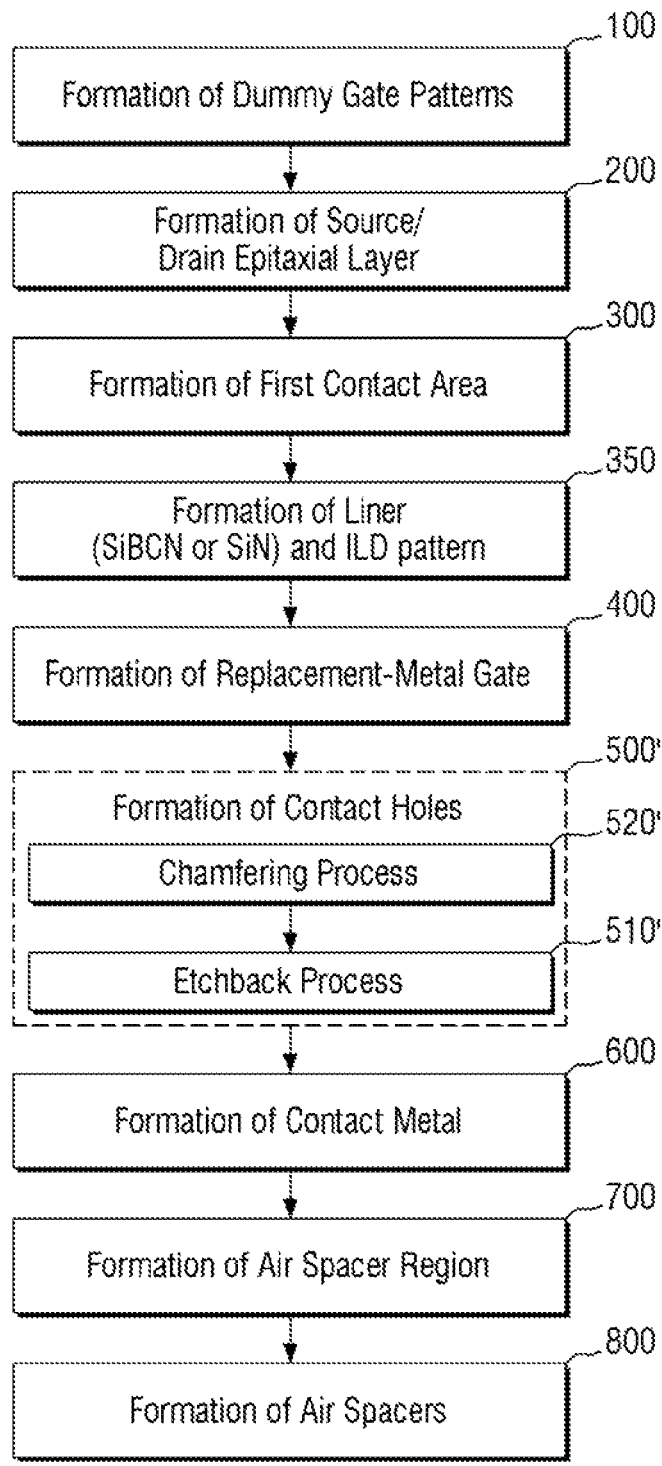
FIG. 18 is a flowchart of fabricating a semiconductor device according to an exemplary embodiment of the present inventive concept.
Figure 19:
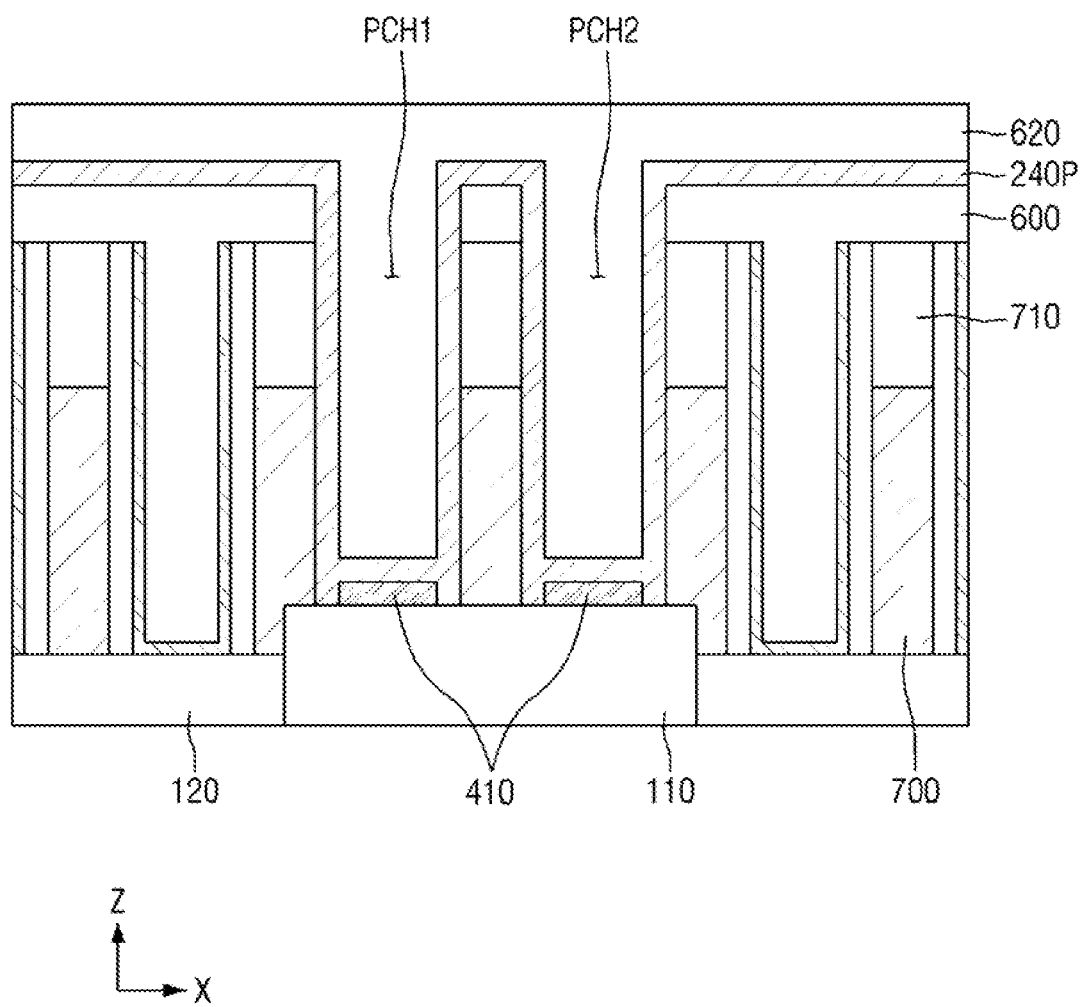
FIGS. 19 to 21 show cross-sectional views of the semiconductor device formed in step 500' of FIG. 18.
Figure 20:
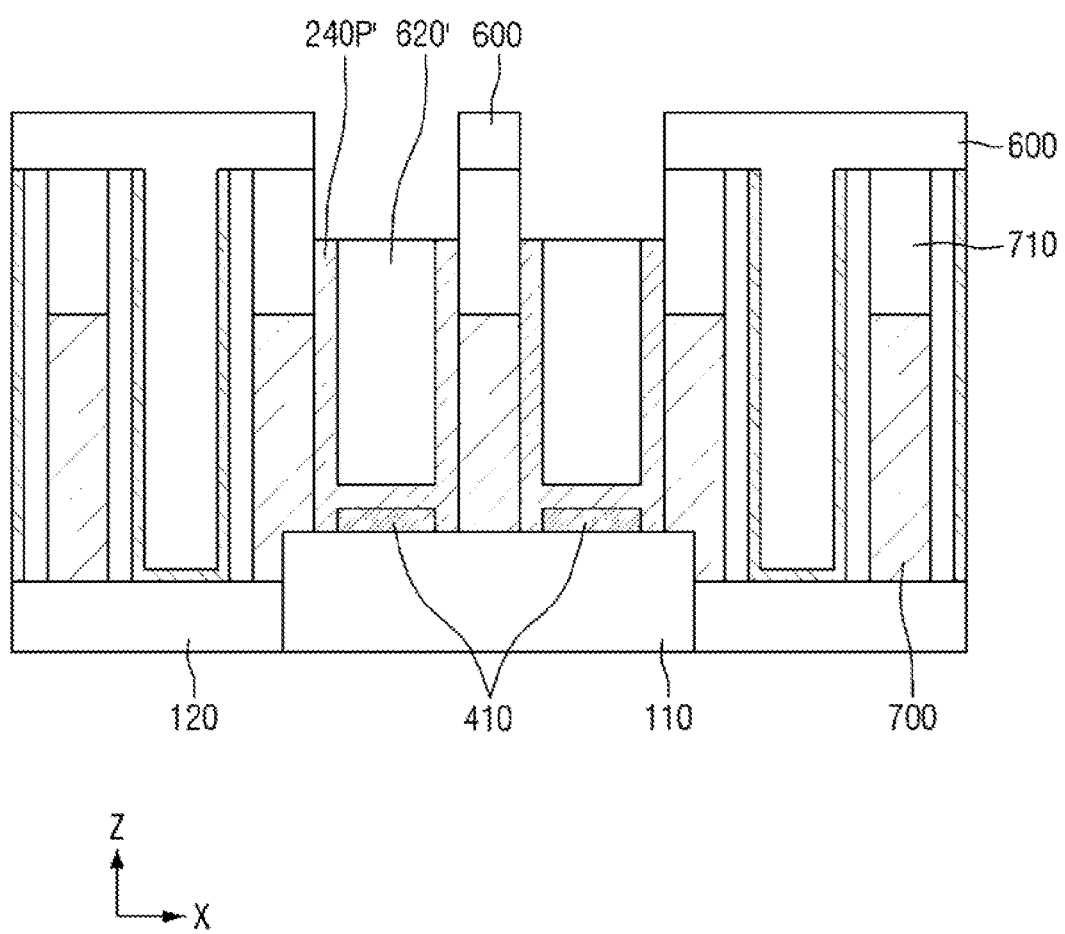
Figure 21:
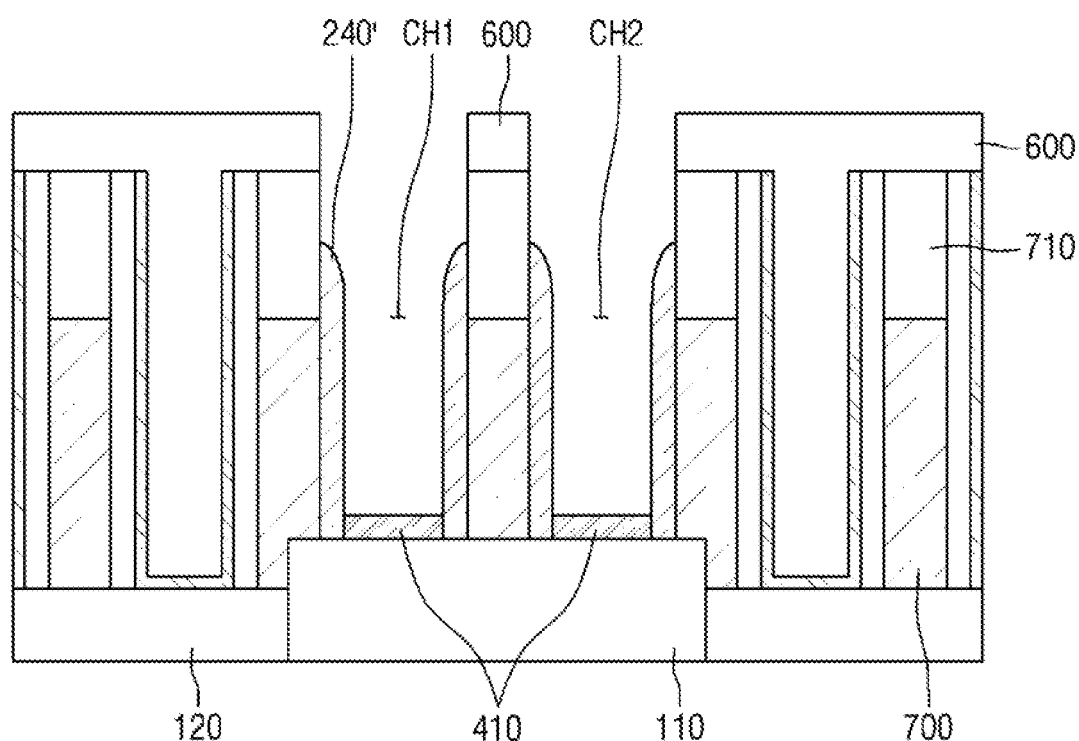
Figure 21:
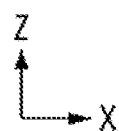

Hereinafter, a method of fabricating a semiconductor device will be described with reference to FIG. 18 to FIG. 21. FIG. 18 is a flowchart of fabricating a semiconductor device according to an exemplary embodiment of the present inventive concept. FIGS. 19 to 21 show cross-sectional views of the semiconductor device formed in step 500' of FIG. 18.

The flowchart of FIG. 18 is substantially the same with the flowchart of FIG. 1, except for step 500' of forming contact holes. In an exemplary embodiment, the contact holes may formed by performing a chamfering process 520' and then by performing an etchback process 510'. The step 500' for forming the contact holes in FIG. 18 will be described with reference to FIGS. 19 to 21.

FIG. 19 shows a preliminary metal gate spacer layer 240P and an OPL 620 formed in step 520' of FIG. 18 according to an exemplary embodiment of the present inventive concept. Before the formation of the preliminary metal gate spacer layer 240P and the OPL 620, the first ILD patterns 600 and liners 500 that are disposed on the active fin structure 110 may be removed using an isotropic etching process from the resulting structure of FIGS. 10A and 10B. And then, the preliminary metal gate spacer layer 240P and the OPL 620 are formed in first preliminary contact holes PCH1 and PCH2 which expose the epitaxial layers 410. In an exemplary embodiment, the preliminary metal gate spacer layer 240P is formed on sidewalls of the metal gate electrodes 700 exposed by the first preliminary contact holes PCH1 and PCH2. The OPL 620 fills completely the first preliminary contact holes PCH1 and PCH2.

The first ILD patterns 600 are disposed on the isolation region 120, and the first preliminary contact holes PCH1 and PCH2 are formed on the active fin structure 110.

FIG. 20 shows a preliminary metal gate spacer 240P' and an recessed OPL 620' after step 520' of FIG. 18 is performed. In step 520', which may be referred to as a chamfering process, upper portions of contact holes CH1 and CH2 of FIG. 21 are formed between two adjacent gate electrode caps 710.

FIG. 21 shows the contact holes CH1 and CH2 formed after step 510' of FIG. 18 is performed. The recessed OPL 620' is completely removed, and then an etchback process is performed on the recessed spacer layer 240P' until the epitaxial regions 410 are exposed through the contact holes CH1 and CH2. In this case, an upper surface of the recessed spacer layer 240P' may be recessed. A corner of the recessed spacer layer 240P' is rounded so that the contact holes CH1 and CH2 are Y-shaped and the recessed spacer layer 240P' becomes a metal gate spacer 240'. The metal gate spacer 240' of FIG. 21 may serve as the metal gate spacer 240' of FIGS. 13A and 13B.

The steps 600 to 800 may be performed on the resulting structure of FIG. 21 to form a transistor having an air spacer between metal gate electrodes and source/drain electrodes.

Figure 22:
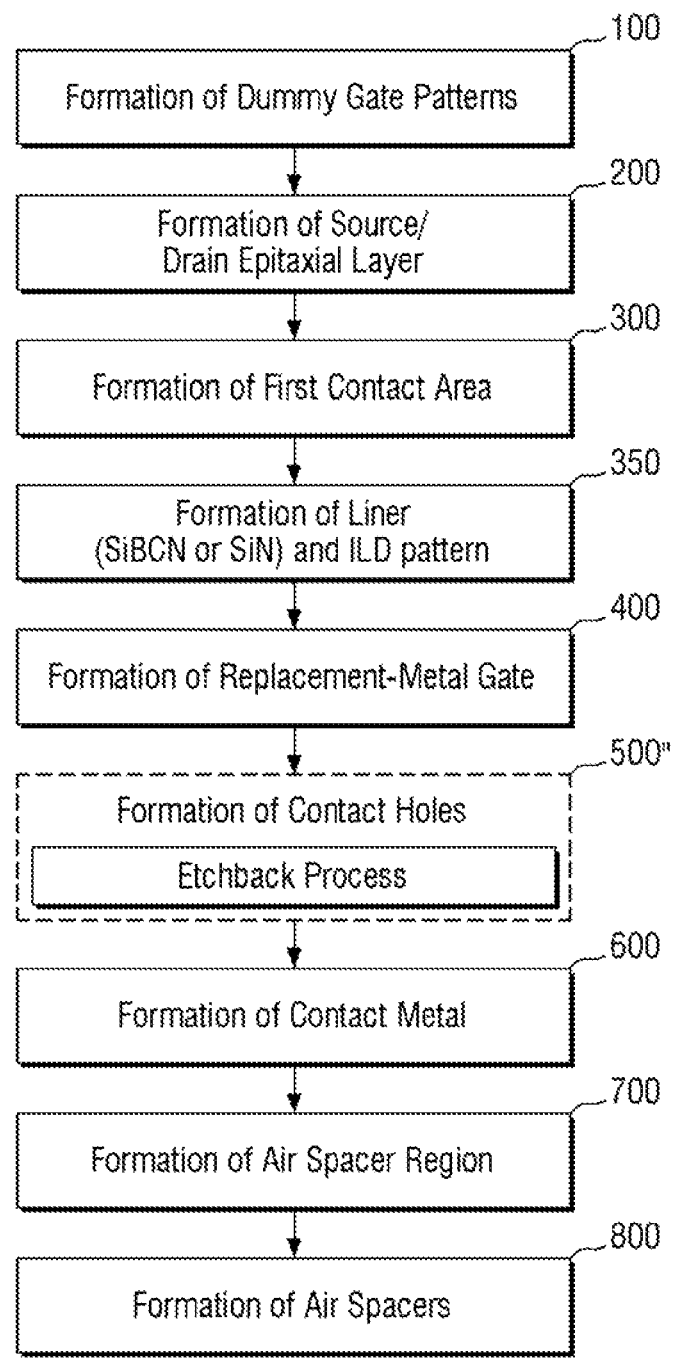
FIG. 22 is a flowchart of fabricating a semiconductor device according to an exemplary embodiment of the present inventive concept.
Figure 23:
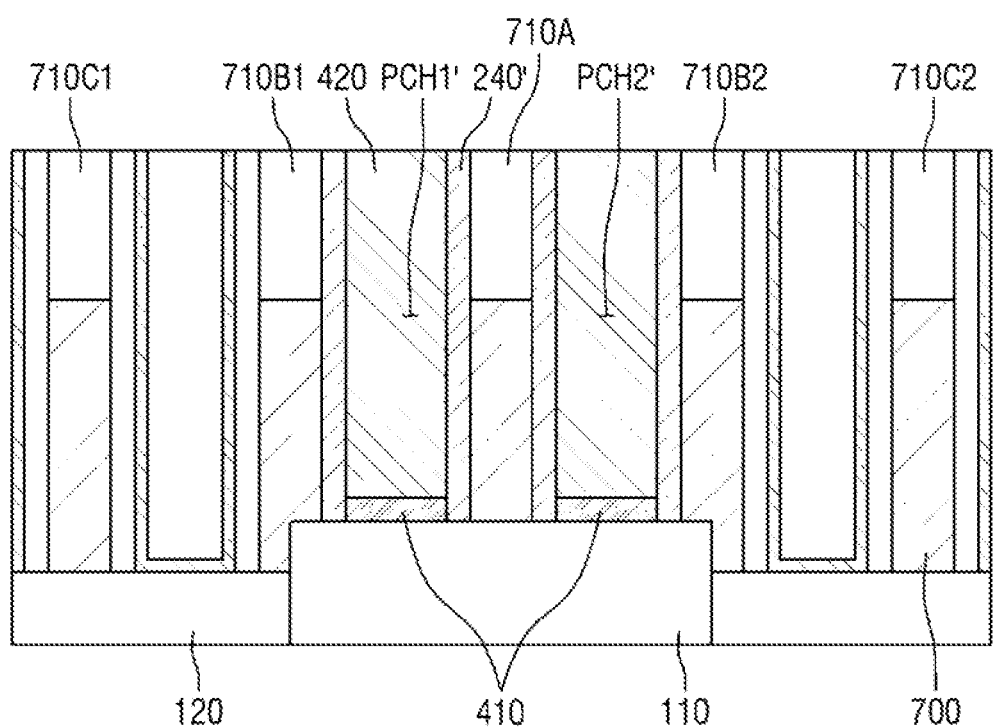
FIGS. 23 to 25 show cross-sectional views of the semiconductor device formed in steps 500" to 800 of FIG. 22.
Figure 24:
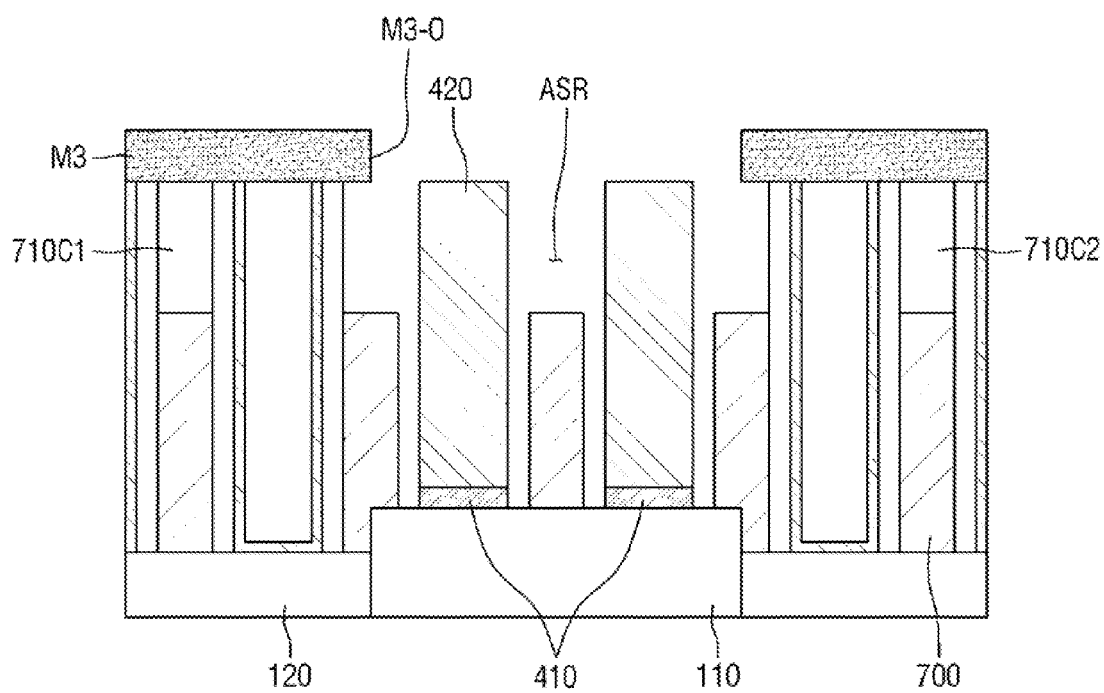
Figure 25:
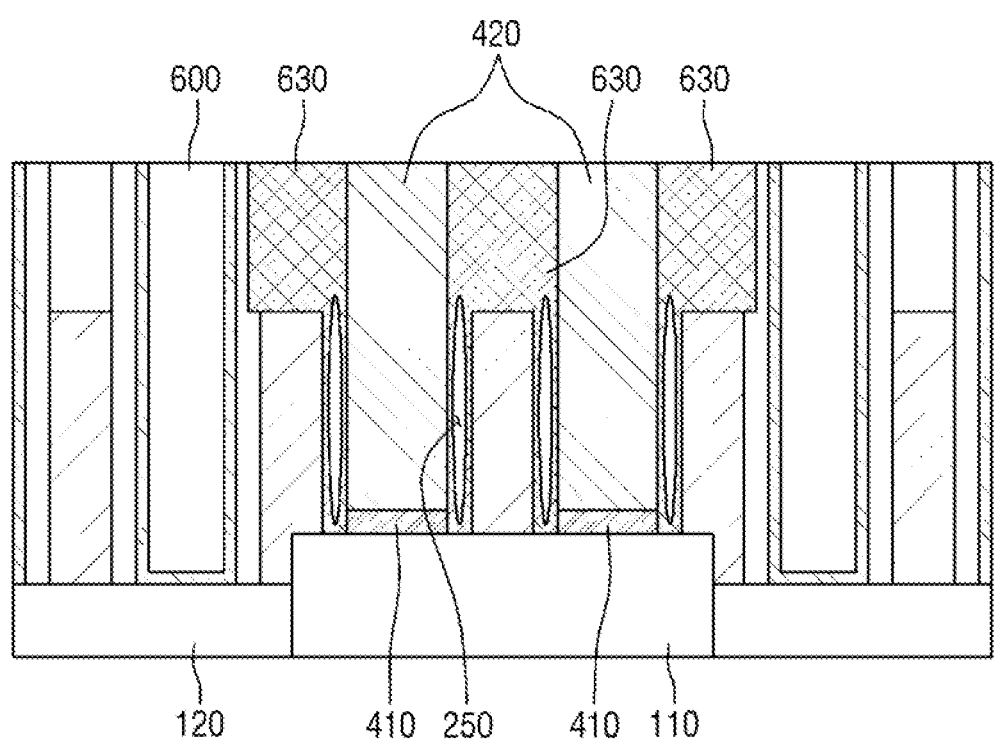

Hereinafter, a method of fabricating a semiconductor device will be described with reference to FIG. 22 to FIG. 25. FIG. 22 is a flowchart of fabricating a semiconductor device according to an exemplary embodiment of the present inventive concept. FIGS. 23 to 25 show cross-sectional views of the semiconductor device formed in steps 500" to 800 of FIG. 22.

The flowchart of FIG. 22 is substantially the same with the flowchart of FIG. 1, except for step 500" for forming of contact holes. In an exemplary embodiment, the formation of the contact holes may performed by the etchback process of FIGS. 11A and 11B, without performing the chamfering process of FIGS. 12A and 12B. In this case, the steps of 600 to 800 are performed on the resulting structure of FIGS. 11A and 11B.

FIG. 23 shows gate metal electrodes 420 formed after steps 500" and 600 are performed on the resulting structure of FIGS. 11A and 11B according to an exemplary embodiment of the present inventive concept.

The step 500" of FIG. 22 includes a planarization process performed on the resulting structure of FIGS. 11A and 11B. The planarization process may include an etchback process or a CMP process. In this case, the planarization process may be performed until upper surfaces of the gate electrode caps 710 are exposed. The metal gate spacer 240' is recessed in the planarization process.

In step 600, a metal layer is formed in the preliminary second contact holes PCH1' and PCH2' defined by the preliminary metal gate spacers 240 of FIG. 11B. After the planarization process of step 500" is performed, the preliminary metal gate spacers 240 of FIG. 11B becomes metal gate spacers 240'.

FIG. 24 shows an air spacer region ASR formed after step 700 of FIG. 22 is performed according to an exemplary embodiment of the present inventive concept. In this step, an RIE process is first performed to remove upper portion of the metal gate spacer 240' and then an isotropic etching process is performed to remove completely the metal gate spacer 240'. In the two step etchings, the gate electrode caps 710A, 710B1 and 710B2 of FIG. 23 that are disposed on the active fin structure 110 are completely removed, except for the gate electrode caps 710C1 and 710C2 that are disposed on the isolation region 120, as similar to FIGS. 16A and 16B.

FIG. 25 shows air spacers 250 formed after step 800 of FIG. 22 is performed according to an exemplary embodiment of the present inventive concept. In this case, the air spacers 250 are not completely covered by the metal gate electrodes 420. In an exemplary embodiment, the metal gate electrodes 700 and the air spacers 250 need not be overlapped when viewed in a planar view.

Figure 26:
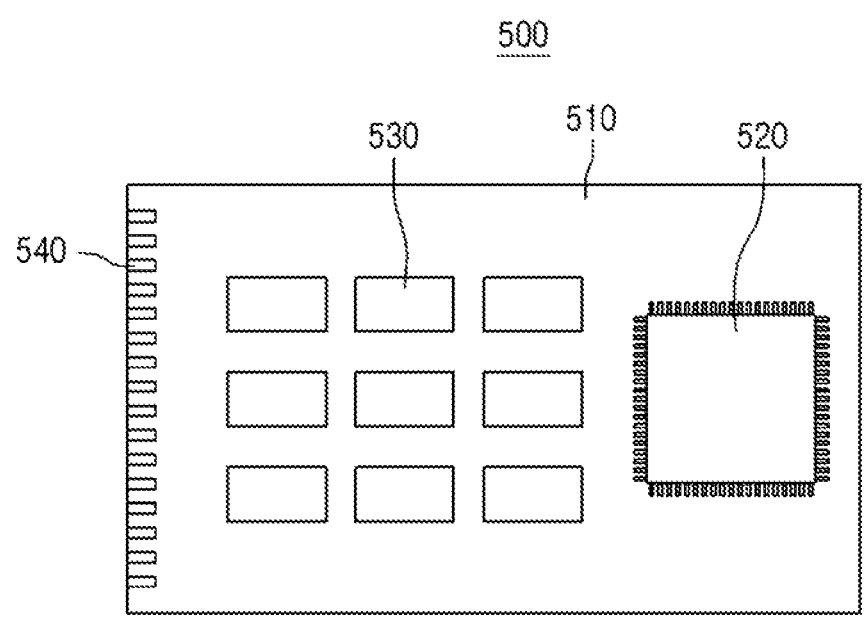
FIG. 26 is a semiconductor module having a semiconductor device fabricated according to an exemplary embodiment of the present inventive concept.

FIG. 26 is a semiconductor module having a semiconductor device fabricated according to an exemplary embodiment of the present inventive concept.

Referring to FIG. 26, the semiconductor module 500 includes a semiconductor device 530. The semiconductor device 530 may be formed according to an exemplary embodiment of the present inventive concept. The semiconductor device 530 is mounted on a semiconductor module substrate 510. The semiconductor module 500 further includes a microprocessor 520 mounted on the semiconductor module substrate 510. Input/output terminals 540 are disposed on at least one side of the semiconductor module substrate 510. The semiconductor module 500 may be included in a memory card or a solid state drive (SSD).

Figure 27:
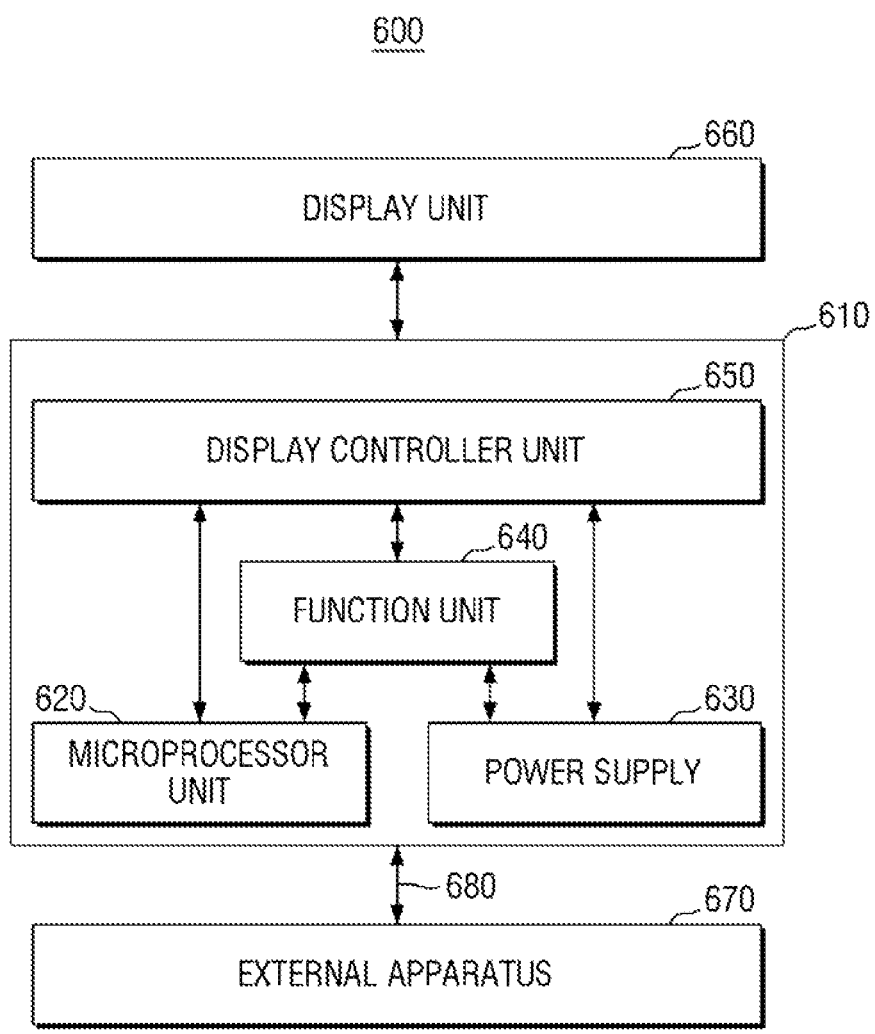
FIG. 27 is a block diagram of an electronic system having a semiconductor device according to an exemplary embodiment of the present inventive concept.

FIG. 27 is a block diagram of an electronic system having a semiconductor device according to an exemplary embodiment of the present inventive concept.

Referring to FIG. 27, a semiconductor device fabricated according to an exemplary embodiment of the present inventive concept may be included in an electronic system 600. The electronic system 600 includes a body 610, a microprocessor unit 620, a power supply 630, a function unit 640, and a display controller unit 650. The body 610 may include a system board or a motherboard having a printed circuit board (PCB) or the like. The microprocessor unit 620, the power supply 630, the function unit 640, and the display controller unit 650 are mounted or disposed on the body 610. A display unit 660 may be stacked on an upper surface of the body 610. For example, the display unit 660 is disposed on a surface of the body 610, displaying an image processed by the display controller unit 650. The power supply 630 receives a constant voltage from an external power supply, generating various voltage levels to supply the voltages to the microprocessor unit 620, the function unit 640, the display controller unit 650, etc. The microprocessor unit 620 receives a voltage from the power supply 630 to control the function unit 640 and the display unit 660. The function unit 640 may perform various functions of the electronic system 600. For example, when the electronic system 600 is a mobile electronic product such as a cellular phone, or the like, the function unit 640 may include various components to perform wireless communication functions such as dialing, video output to the display unit 660 or voice output to a speaker through communication with an external device 670, and when a camera is included, it may serve as an image processor. In an exemplary embodiment, if the electronic system 600 is connected to a memory card to expand the storage capacity, the function unit 640 may serve as a memory card controller. The function unit 640 may exchange signals with the external device 670 through a wired or wireless communication unit 680. Further, when the electronic system 600 requires a Universal Serial Bus (USB) to extend the functions, the function unit 640 may serve as an interface controller. The function unit 640 may include a semiconductor device fabricated according to an exemplary embodiment of the present inventive concept.

Figure 28:
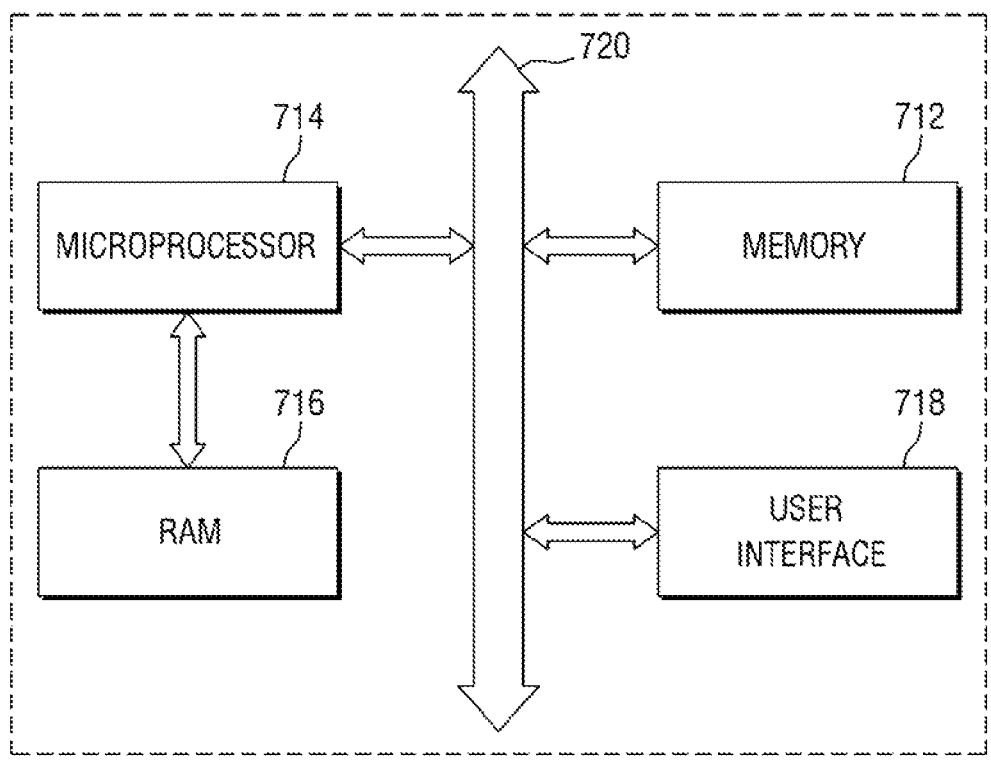
FIG. 28 is a block diagram of an electronic system having a semiconductor device fabricated according to an exemplary embodiment of the present inventive concept.

FIG. 28 is a block diagram of an electronic system having a semiconductor device fabricated according to an exemplary embodiment of the present inventive concept.

Referring to FIG. 28, the electronic system 700 may be included in a mobile device or a computer. For example, the electronic system 700 includes a memory system 712, a microprocessor 714, a random access memory (RAM) 716, and a user interface 718 configured to perform data communication using a bus 720. The microprocessor 714 may program and control the electronic system 700. The RAM 716 may be used as an operational memory of the microprocessor 714. For example, the microprocessor 714 or the RAM 716 may include a semiconductor device fabricated according an exemplary embodiment of the present inventive concept.

The microprocessor 714, the RAM 716, and/or other components may be assembled within a single package. The user interface 718 may be used to input or output data to or from the electronic system 700. The memory system 712 may store operational codes of the microprocessor 714, data processed by the microprocessor 714, or data received from the outside. The memory system 712 may include a controller and a memory.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device, comprising:
    forming an active fin structure and an isolation region on a substrate;
    forming an epitaxial layer on the active fin structure;
    forming a first metal gate electrode and a second metal gate electrode on the active fin structure;
    forming a first gate electrode cap and a second gate electrode cap on upper surfaces of the first and second metal gate electrodes, respectively;
    forming a first metal gate spacer and a second metal gate spacer on a first sidewall of the first metal gate electrode and a first sidewall of the second metal gate electrode, respectively, wherein the first sidewall of the first metal gate electrode and the first sidewall of the second metal gate electrode face each other and wherein the epitaxial layer is interposed between the first metal gate spacer and the second metal gate spacer;
    forming a source/drain electrode on the epitaxial layer and between the first and second metal gate spacers;
    form an air spacer region by removing the first and second gate electrode caps and the first and second metal gate spacers; and
    forming first and second air spacers within the air spacer region,
    wherein the first air spacer is interposed between the source/drain electrode and the first metal gate electrode and
    wherein the second air spacer is interposed between the source/drain electrode and the second metal gate electrode.

2. The method of claim 1,
    wherein the forming of the first and second air spacers within the air spacer region includes forming a low-k ILD pattern within the air spacer region so that the first and second air spacers are formed within the low-k ILD pattern.

3. The method of claim 1,
    wherein the first air spacer and the second air spacer are connected to each other so that the source/drain electrode is surrounded by an air spacer including the first and second air spacers.

4. The method of claim 1,
    wherein the forming of the first and second metal gate spacers includes:
        forming a preliminary metal gate spacer layer on the first sidewall of the first metal gate electrode, the first sidewall of the second metal gate electrode and the epitaxial layer;
        performing an isotropic etching process on the preliminary metal gate spacer layer to form a preliminary first metal gate spacer on the first sidewall of the first metal gate electrode and a preliminary second metal gate spacer on the first sidewall of the second metal gate electrode; and
        after the performing of the isotropic etching process, performing an anisotropic etching process to recess the preliminary first and second metal gate spacers and to expose the epitaxial layer so that the first and second metal gate spacers are formed on the first sidewall of the first metal gate electrode and the first sidewall of the second metal gate electrode.

5. The method of claim 4,
    wherein the source/drain electrode is Y-shaped.

6. The method of claim 5,
    wherein the Y-shaped source/drain electrode includes a lower portion which is in contact with the active fin structure and an upper portion having an overhang part on the lower portion, and
    wherein the first and second air spacers are formed under the overhang part of the Y-shaped source/drain electrode.

7. The method of claim 1,
    wherein the forming of the first and second metal gate spacers includes:
        forming a preliminary metal gate spacer layer on the first sidewall of the first metal gate electrode, the first sidewall of the second metal gate electrode and the epitaxial layer;
        performing an anisotropic etching process on the preliminary metal gate spacer layer to form a preliminary first metal gate spacer on the first sidewall of the first metal gate electrode and a preliminary second metal gate spacer on the first sidewall of the second metal gate electrode; and
        after the performing of the anisotropic etching process, performing an isotropic etching process to recess the preliminary first and second metal gate spacers so that the first and second metal gate spacers are formed on the first sidewall of the first metal gate electrode and the first sidewall of the second metal gate electrodes, respectively.

8. The method of claim 7,
    wherein the source/drain electrode is T-shaped.

9. The method of claim 8,
    wherein the T-shaped source/drain electrode includes a lower portion which is in contact with the active fin structure and an upper portion having an overhang part on the lower portion, and
    wherein the first and second air spacers are formed under the overhang part of the T-shaped source/drain electrode.

10. The method of claim 1,
    wherein the epitaxial layer is spaced apart from the first and second metal gate electrodes.

11. The method of claim 10,
    wherein the forming of the air spacer region includes:
        performing an anisotropic etching process on the first and second gate electrode caps to expose the first and second metal gate spacers; and performing an isotropic etching process to remove the first and second metal gate spacers to form the air spacer region, wherein the air spacer region exposes the active fin structure.

12. The method of claim 11,
wherein the first gate electrode cap is formed of SiBCN or SiN, and
wherein the first metal gate spacer is formed of a low-k dielectric material.

13. A method of fabricating a semiconductor device, comprising:
forming an active fin structure and an isolation region on a substrate;
forming a first dummy gate electrode and a second dummy gate electrode on the active fin structure;
forming a first dummy gate spacer and a second dummy gate spacer on a first sidewall of the first dummy gate electrode and a first sidewall of the second dummy gate electrode, respectively, wherein the first sidewall of the first dummy gate electrode and the first sidewall of the second dummy gate electrode face each other;
forming an epitaxial layer on the active fin structure and between the first and second dummy gate spacers;
removing the first and second dummy gate spacers;
replacing the first and second dummy gate electrodes with first and second metal gate electrodes, respectively;
forming a first metal gate spacer and a second metal gate spacer on a first sidewall of the first metal gate electrode and a first sidewall of the second metal gate electrode, respectively;
forming a source/drain electrode between the first metal gate spacer and the second metal gate spacer and on the epitaxial layer; and
replacing the first and second metal gate spacers with an air spacer,
wherein the air spacer is interposed between the source/drain electrode and the first metal gate spacer and between the source/drain electrode and the second metal gate spacer.

14. The method of claim 13,
wherein the replacing of the first and second metal gate spacers with the first and second air spacers includes:
removing the first and second metal gate spacers to form an air spacer region between the source/drain electrode and the first metal gate electrode and the source/drain electrode and the second metal gate electrode; and
filling a low-k ILD pattern in the air spacer region so that the low-k ILD pattern includes a void inside the low-k ILD pattern,
wherein the void is the air spacer.

15. The method of claim 13, further comprising:
forming a third dummy gate electrode on the isolation region;
forming a third dummy gate spacer on a second sidewall of the first dummy gate electrode and a fourth dummy gate spacer on a first sidewall of the third dummy gate electrode, wherein the second sidewall of the first dummy gate electrode and the first sidewall of the third dummy gate spacer face each other; and
replacing the third dummy gate electrode with a third metal gate electrode,
wherein the replacing of the third dummy gate electrode and the replacing of the first and second dummy gate electrodes are performed at substantially the same time, and
wherein after the replacing of the first dummy gate electrode, the first metal gate electrode is interposed between the first metal gate spacer and the third dummy gate spacer.

16. The method of claim 15,
wherein the first dummy gate electrode is further formed on the isolation region so that the first dummy gate electrode is formed on a boundary between the active fin structure and the isolation region.

17. The method of claim 15,
wherein the first metal gate spacer is formed of a low-k dielectric material and
wherein the third dummy gate spacer is formed of SiN or SiBCN.

* * * * *